United States Patent
Fukushima et al.

(10) Patent No.: US 10,247,844 B2
(45) Date of Patent: Apr. 2, 2019

(54) METHOD AND SYSTEM FOR DETECTION OF A MATERIAL WITHIN A REGION OF THE EARTH

(71) Applicants: Eiichi Fukushima, Albuquerque, NM (US); Stephen A. Altobelli, Albuquerque, NM (US); Hans Thomann, Bedminster, NJ (US)

(72) Inventors: Eiichi Fukushima, Albuquerque, NM (US); Stephen A. Altobelli, Albuquerque, NM (US); Hans Thomann, Bedminster, NJ (US)

(73) Assignee: ExxonMobil Upstream Research Company, Spring, TX (US)

(*) Notice: Subject to any disclaimer, the term of this patent is extended or adjusted under 35 U.S.C. 154(b) by 330 days.

(21) Appl. No.: 15/035,491

(22) PCT Filed: Dec. 4, 2013

(86) PCT No.: PCT/US2013/073159
§ 371 (c)(1),
(2) Date: May 10, 2016

(87) PCT Pub. No.: WO2015/084347
PCT Pub. Date: Jun. 11, 2015

(65) Prior Publication Data
US 2016/0291191 A1  Oct. 6, 2016

(51) Int. Cl.
*G01V 3/14* (2006.01)
*G01R 33/3415* (2006.01)
(Continued)

(52) U.S. Cl.
CPC .......... *G01V 3/14* (2013.01); *G01R 33/3415* (2013.01); *G01R 33/445* (2013.01); *G01R 33/4616* (2013.01); *G01R 33/4838* (2013.01)

(58) Field of Classification Search
CPC .............. G01R 33/3415; G01R 33/445; G01R 33/4616; G01R 33/4838
See application file for complete search history.

(56) References Cited

U.S. PATENT DOCUMENTS 3,019,383 A  1/1962 Russell
3,665,446 A  5/1972 Hibbard
(Continued)

OTHER PUBLICATIONS

Altobelli, S. et al., "Earth's field NMR for detection of thin layers of liquids," 12th International Conference on Magnetic Resonance Microscopy Cambridge, UK, pp. 1-5 (Aug. 26, 2013).
(Continued)

*Primary Examiner* — Tung X Nguyen
*Assistant Examiner* — Dominic E Hawkins
(74) *Attorney, Agent, or Firm* — ExxonMobil Upstream Research Company—Law Department

(57) ABSTRACT

Methods and systems for detecting a material within a region of the Earth are provided. The region may be under a surface of earthen formation, ice, snow, or water. The method may be practiced in a variety of applications, for example in an arctic region to detect oil spills, leaks, or seepages. The methods and systems may include using at least one coil to transmit a radio frequency (RF) excitation signal into the region of the Earth; and receive any NMR response signals to determine the presence of the material of interest.

29 Claims, 14 Drawing Sheets

(51) Int. Cl.
*G01R 33/44* (2006.01)
*G01R 33/46* (2006.01)
*G01R 33/483* (2006.01)

(56) References Cited

U.S. PATENT DOCUMENTS

| | | | |
|---|---|---|---|
| 4,022,276 A | 5/1977 | Dreher et al. | |
| 4,053,406 A | 10/1977 | Deslauriers et al. | |
| 4,449,047 A | 5/1984 | Monroe | |
| 4,595,878 A | 6/1986 | Bradshaw | |
| 4,695,799 A * | 9/1987 | Hardy | G01R 33/446 |
| | | | 324/307 |
| 4,769,602 A | 9/1988 | Vinegar et al. | |
| 4,868,500 A | 9/1989 | Baldwin et al. | |
| 5,433,717 A | 7/1995 | Rubinsky et al. | |
| 5,517,115 A | 5/1996 | Prammer | |
| 5,583,437 A | 12/1996 | Smith et al. | |
| 5,602,477 A | 2/1997 | McCarthy et al. | |
| 5,673,050 A | 9/1997 | Moussally et al. | |
| 5,706,810 A | 1/1998 | Rubinsky et al. | |
| 5,903,153 A | 5/1999 | Clarke et al. | |
| 5,999,836 A | 12/1999 | Nelson et al. | |
| 6,177,794 B1 | 1/2001 | Stoeffl | |
| 6,177,797 B1 | 1/2001 | Srinivasan | |
| 6,216,540 B1 | 4/2001 | Nelson et al. | |
| 6,345,194 B1 | 2/2002 | Nelson | |
| 6,346,813 B1 | 2/2002 | Klenberg | |
| 6,621,448 B1 | 9/2003 | Lasky et al. | |
| 6,690,316 B2 | 2/2004 | Yankielun | |
| 6,718,266 B1 * | 4/2004 | Sinha | G01V 1/48 |
| | | | 367/75 |
| 6,794,864 B2 | 9/2004 | Mirotchnik et al. | |
| 6,825,657 B2 | 11/2004 | Kleinberg et al. | |
| 6,867,589 B2 | 3/2005 | Heaton | |
| 6,891,369 B2 | 5/2005 | Hurlimann et al. | |
| 7,253,617 B1 | 8/2007 | Chen et al. | |
| 7,298,142 B2 | 11/2007 | Hursan et al. | |
| 7,423,426 B2 | 9/2008 | Reiderman | |
| 7,663,363 B2 | 2/2010 | Reiderman | |
| 8,294,468 B2 | 10/2012 | Reiderman | |
| 8,436,609 B2 | 5/2013 | Srnka et al. | |
| 9,103,889 B1 | 8/2015 | Fukushima | |
| 2003/0020647 A1 | 1/2003 | Yankielun | |
| 2005/0189945 A1 | 9/2005 | Reiderman | |
| 2006/0255799 A1 * | 11/2006 | Reiderman | G01N 24/081 |
| | | | 324/303 |
| 2007/0047117 A1 | 3/2007 | Wang | |
| 2008/0206887 A1 | 8/2008 | Chen et al. | |
| 2008/0284426 A1 | 11/2008 | Shorey et al. | |
| 2010/0085048 A1 * | 4/2010 | Bouchard | G01R 33/48 |
| | | | 324/307 |
| 2010/0203516 A1 | 8/2010 | Campbell et al. | |
| 2010/0271030 A1 * | 10/2010 | Reiderman | G01V 3/28 |
| | | | 324/338 |
| 2010/0274491 A1 | 10/2010 | Andersen et al. | |
| 2011/0144474 A1 * | 6/2011 | Ouwerkerk | A61B 5/055 |
| | | | 600/410 |
| 2011/0181279 A1 * | 7/2011 | Srnka | G01N 24/08 |
| | | | 324/307 |
| 2012/0165215 A1 | 6/2012 | Andersen et al. | |
| 2012/0171978 A1 * | 7/2012 | Sharma | H04B 1/1638 |
| | | | 455/230 |
| 2013/0141102 A1 * | 6/2013 | Donderici | G01V 3/30 |
| | | | 324/338 |
| 2013/0176030 A1 * | 7/2013 | Simon | G01V 3/30 |
| | | | 324/333 |
| 2014/0203806 A1 * | 7/2014 | Grunewald | G01N 24/084 |
| | | | 324/309 |

OTHER PUBLICATIONS

Altobelli, S. et al., "Earth's field NMR for detection of thin layers of liquids," 12$^{th}$ International Conference on Magnetic Resonance Microscopy Cambridge, UK, pp. 6-13 (Aug. 26, 2013).

Altobelli, S. et al., "Earth's field NMR for detection of thin layers of liquids," 12$^{th}$ International Conference on Magnetic Resonance Microscopty Cambridge, UK, pp. 14-28 (Aug. 26, 2013).

Dickins, D.F., "Detection and Tracking of Oil under Ice," Report submitted to the US Department of the Interior Minerals Management Service, 57 pages (Oct. 6, 2000).

Dickens, D.F. et al., "2006 Svalbard Experimental Spill to Study Spill Detection and Oil Behavior in Ice Summary Field Report," pp. 1-13 (Apr. 12, 2006).

Gev, I. et al., "Detection of the Water Level of Fractured Phreatic Aquifers Using Nuclear Magnetic Resonance (NMR) Geophysical Measurements," *J. of Applied Geophysics* 34, pp. 277-282 (1996).

Legchenko, A. et al., "Nuclear Magnetic resonance as Geophysical Tool of Hydrogeologists," *J. of Applied Geophysics* 50, pp. 21-46 (2002).

Mohnke, O. et al., "Smooth and Block Inversion of Surface NMR Amplitudes and Decay Times Using Simulated Annealing," *J. of Applied Geophysics* 50, pp. 163-177 (2002).

Pape, H. et al., "Pore Geometry of Sandstone Derived from Pulsed Field Gradient NMR," *J. of Applied Geophysics* 58, pp. 232-252 (2006).

Palandro, D. et al., "Using Nuclear Magnetic Resonance in the Earth's Magnetic Field to Detect Oil Under Ice," 2013 AMOP Conference, 23 pgs. (Jun. 4-6, 2013).

Ramasami, V. et a., "A low frequency wideband depth sounder for sea ice, *IEEE*, 3 pgs. (2003)".

Ramsey, N.F., "Molecuar Beams," Oxford, At the Clarendon Press, pp. 122-123 (1956).

Shushakov, O.A. et al., "Hydrocarbon Contamination of Aquifers by SNRM Detection," WM'04 Conference, Tucson, AZ, WM-4566, 7 pgs. (Feb. 29-Mar. 4, 2004).

Slichter, C.P., "Principles of Magnetic Resonance," 2nd Edition Springer Series in Solid-State Sciences, pp. 20-26, 43-50, 192-223, 229-232, 244-249 (1980).

Weichman, P.B. et al., "Study of Surface Nuclear Magnetic Resonance Inverse Problems," *J. of Applied Geophysics* 50, pp. 129-147 (2002).

* cited by examiner

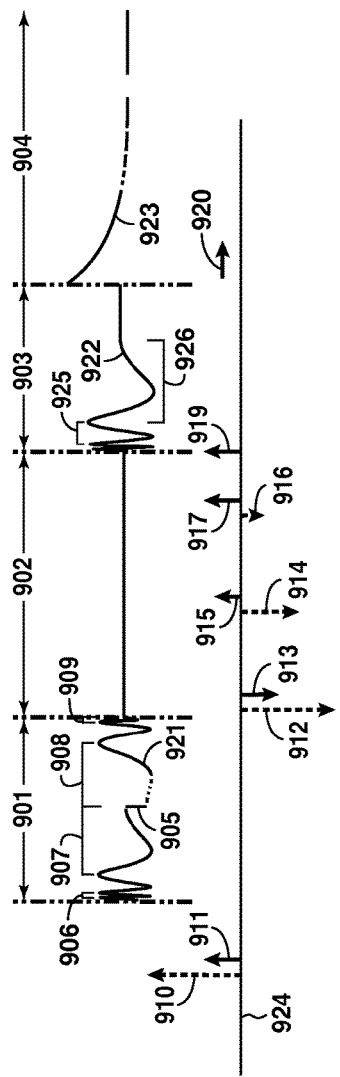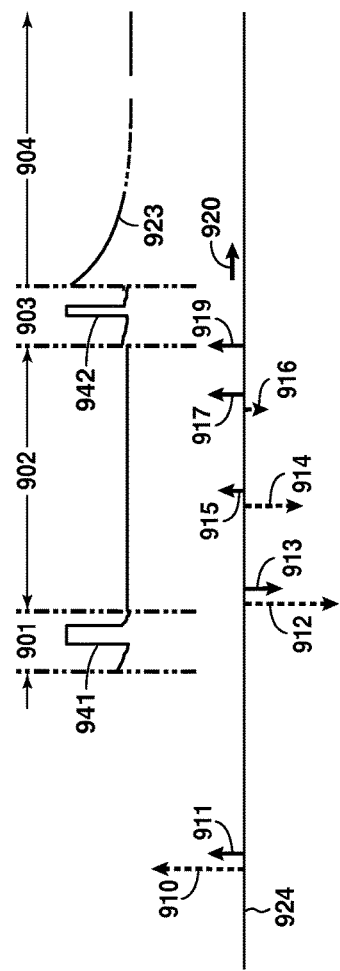

METHOD AND SYSTEM FOR DETECTION OF A MATERIAL WITHIN A REGION OF THE EARTH

This application is the National Stage of International Application No. PCT/US2013/073159, filed 4 Dec. 2013, the entire contents of which are hereby incorporated by reference herein.

BACKGROUND

This disclosure generally relates to a method and apparatus for the detection of a material within a region of the Earth.

This section is intended to introduce various aspects of the art, which may be associated with one or more embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Oil production or transfer in ice-prone marine or freshwater locations could result in a subsurface release—for example from a well blowout or leaking pipeline—that results in oil trapped within or beneath ice. Oil-spill countermeasures will require that this oil is accurately located and mapped.

The detection of oil within or under ice has been of concern since the exploration and production for hydrocarbon resources in the Arctic began in the early 1970's. There have been numerous attempts to detect oil under ice using acoustics, optical/UV excitation, and ground penetrating radar (for a review, see "Detection and Tracking of Oil under Ice", D. F. Dickins, report submitted to the US Department of the Interior Minerals Management Service, Oct. 6, 2000). All of these techniques have shown the capability to detect oil under ice with some success; however, they have not been used in the field. The methods proposed to date have a limited range of applicability and are susceptible to false positive results. They also have only a limited ability to "see" or detect oil through a layer of ice and require contact with the ice surface.

Notably, all three of these methods require access and traverse across the ice surface, some require the removal of snow cover, and special care must be taken to ensure good ice contact with the sensor. The surface access limitation presents both logistic and safety concerns such as breakthrough, and limits the coverage to a small area per day.

Dickins, et al. (2006) successfully detected oil under ice using ground-penetrating radar using a skid-mounted unit pulled along the ice surface (see "2006 Experimental Spill to Study Spill Detection and Oil Behavior in Ice", D. F. Dickins, P. J. Brandvik, L. G. Faksness, J. Bradfor, and L. Liberty; report submitted to the US Department of the Interior Minerals Management Service, Dec. 15, 2006, contract number 1435-0106CT-3925). Tests with the system mounted in a helicopter were less conclusive although additional research is mentioned as being planned.

Nuclear magnetic resonance ("NMR") is a tool used for the characterization of the molecular composition of liquids and solids. More particularly, in some applications NMR is used to distinguish between a solid (e.g. rock in the Earth) and a liquid (e.g. ground water or oil). NMR molecular characterization works by placing a sample in a static magnetic field to align the magnetic moments of the protons with the field. The proton magnetic moments are then perturbed using one or more radio frequency (RF) excitation signals. The energy released or emitted as these magnetic moments return to equilibrium is monitored by a receiver.

In the oil and gas industry, NMR is applied in reservoir characterization in the field for well logging measurements and in laboratory analysis of rock cores. The NMR logging tool technology is capable of directly detecting the signals from fluids in the rock pore space and differentiating between different types and phases of fluids. In well logging, a magnet and a radio frequency transmitter/receiver is lowered into the bore hole. NMR well logging tools, such as those in commercial use by oilfield service companies such as Schlumberger, Halliburton and BakerHughes, detect fluids in the pore space over a volume on the order of several cubic decimeters ($dm^3$). An example of such a tool is CMR PLUS™ or MR SCANNER™ by Schlumberger.

NMR has also been used to detect aquifers (e.g. an underground formation including ground water). Such instruments typically utilize the Earth's magnetic field as the static magnetic field, detect a larger volume than the downhole devices (cubic meters ($m^3$) rather than $dm^3$), and are placed on the Earth's surface for operation. Examples of such a system are NUMIS™ and NUMIS PLUS™ by Iris Instruments and GMR™ by Vista Clara. These devices typically utilize a 100 meter diameter wire loop coil placed flat on the ground as the transmitting/receiving coil. The large loop coil permits the sensing of aquifers over a larger volume than the downhole devices ($m^3$ v. $dm^3$) and depths (up to 150 m). A measurement time of one hour or more per detection volume is typically required. Current NMR research in geophysical applications addresses difficulties that arise when attempting to identify liquids located in pores or at a surface between a liquid and a solid. See, e.g., PAPE, et al., Pore Geometry of Sandstone Derived from Pulsed Field Gradient NMR, J. of Applied Geophysics 58, pp. 232-252 (2006).

In U.S. Pat. No. 8,436,609, NMR is described in an application to detect liquid under a surface, in particular oil under ice or snow, using the Earth's magnetic field. The NMR coil is mounted to a helicopter to remotely detect the presence of oil under ice or snow.

While NMR tools have been used for a variety of applications, it is desired to improve the signal intensity including signal-to-noise ratio and ability to detect materials within a region of the Earth.

Other useful information may be found in the following references: U.S. Pat. No. 3,019,383; U.S. Pat. No. 4,022,276; U.S. Pat. No. 4,769,602; U.S. Pat. No. 4,868,500; Gev, et al., Detection of the Water Level of Fractured Phreatic Aquifers Using Nuclear Magnetic Resonance (NMR) Geophysical Measurements, J. of Applied Geophysics 34, pp. 277-282 (1994); SLICHTER, CHARLES P., Principles of Magnetic Resonance, 2nd Edition Springer Series in Solid-State Sciences, (1996); LEGCHENKO, et al., Nuclear Magnetic Resonance as a Geophysical Tool for Hydrogeologists, J. of Applied Geophysics 50, pp. 21-46 (2002); WEICHMAN, et al., Study of Surface Nuclear Magnetic Resonance Inverse Problems, J. of Applied Geophysics 50, pp. MOHNKE, et al., Smooth and Block Inversion of Surface NMR Amplitudes and Decay Times Using Simulated Annealing, J. of Applied Geophysics 50, pp. 163-177 (2002); SHUSHAKOV, et al., Hydrocarbon Contamination of Aquifers by SNMR Detection, WM'04 Conference, Feb. 29-Mar. 4, 2004, Tucson, Ariz.

SUMMARY

This summary is meant to provide an introduction of the various embodiments further described herein and is not meant to limit the scope of claimed subject matter.

In one aspect, the present disclosure relates to a method for detecting a material within a region of interest in the Earth, in particular a method for detecting a first material in the presence of a second material within a region of the Earth. The method comprises transmitting a first inversion radio frequency (RF) excitation signal to the region in a static magnetic field. The region includes a first material and a second material. The first inversion RF excitation signal is sufficient to invert magnetization vectors of both the first material and the second material in an inversion region within the region of interest. A plurality of magnetization vectors of the first material and the second material are substantially aligned with the negative (−) z axis after the first RF excitation signal. The method further comprises transmitting a second RF excitation signal with the at least one coil to the region of interest such that the NMR signal from the second material is selectively suppressed in a detection region at a given distance remote from the at least one coil; and receiving any NMR signals of the first material generated by the second RF excitation signal originating from the detection region.

In another aspect, the present disclosure relates to a system for detecting a material within a region of interest in the Earth. The system comprising: at least one coil positioned proximate to the region; a transmitter operatively connected to the at least one coil; a receiver operatively connected to the at least one coil; and at least one switch. The system configured to provide a broadband signal response in the at least one coil at a transmitting Q factor when transmitting an adiabatic fast passage signal and to receive a NMR signal response in a narrowband at a greater Q factor compared to the transmitting Q factor.

Other aspects of the present disclosure will be apparent from the following description and the appended claims.

BRIEF DESCRIPTION OF THE DRAWINGS

The foregoing and other advantages of the present technique may become apparent upon reading the following detailed description and upon reference to the drawings in which:

FIG. 9A is a schematic of an excitation signal sequence in accordance with one or more embodiments of the present disclosure.

FIG. 9B is a schematic of an excitation signal sequence in accordance with one or more embodiments of the present disclosure.

DETAILED DESCRIPTION

Figure 1A:
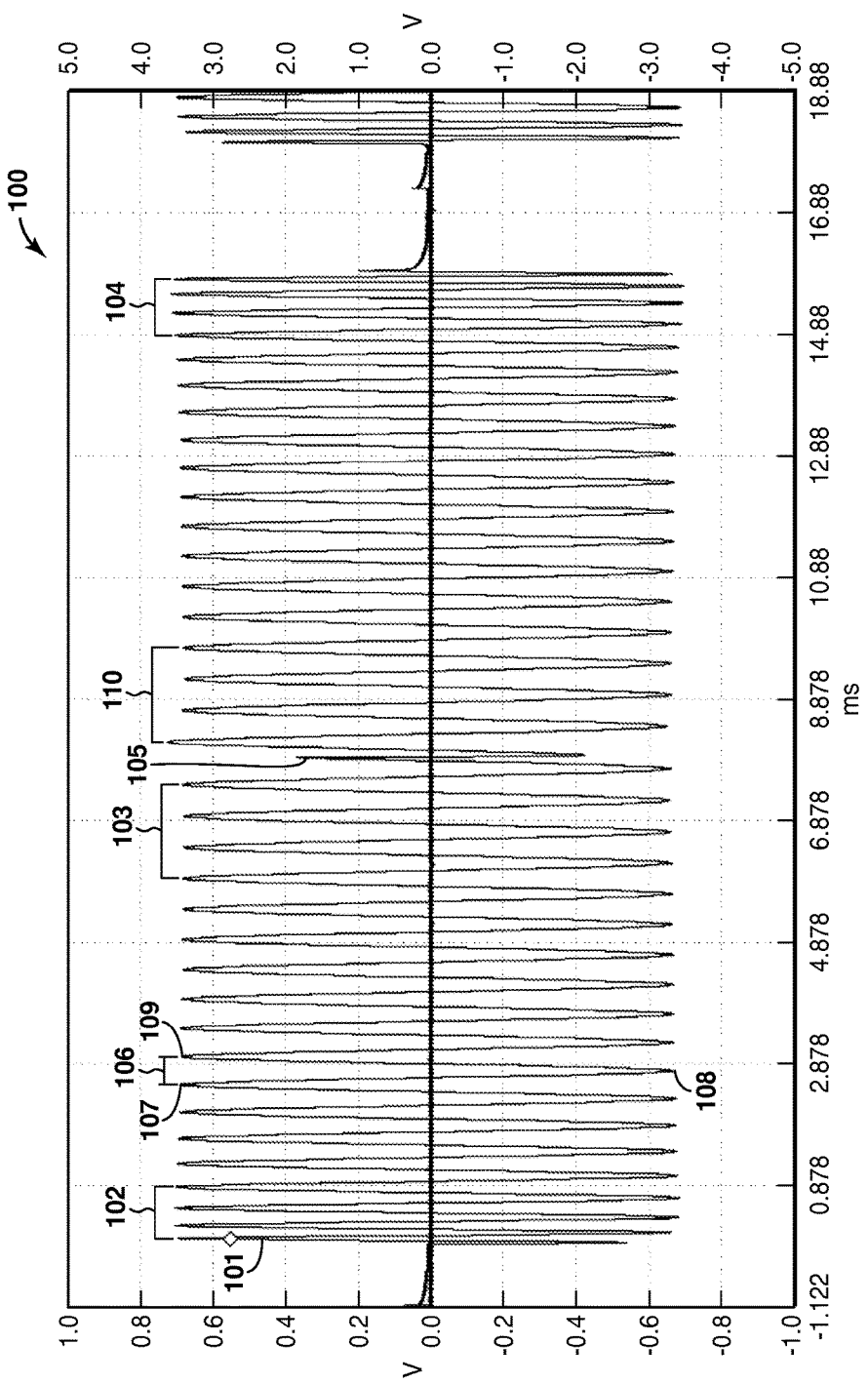
FIG. 1A illustrates an adiabatic fast passage inversion excitation signal according to one or more embodiments of the present disclosure.

In the following detailed description section, the specific embodiments of the present disclosure are described in connection with one or more embodiments. However, to the extent that the following description is specific to a particular embodiment or a particular use of the present disclosure, this is intended to be for exemplary purposes only and simply provides a description of the one or more embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

Certain terms are used throughout the following description and claims to refer to particular features or components. As one skilled in the art would appreciate, different persons may refer to the same feature or component by different names. This document does not intend to distinguish between components or features that differ in name only. The drawing figures are not necessarily to scale. Certain features and components herein may be shown exaggerated in scale or in schematic form and some details of conventional elements may not be shown in the interest of clarity and conciseness. When referring to the figures described herein, the same reference numerals may be referenced in multiple figures for the sake of simplicity. In the following description and in the claims, the terms "including" and "comprising" are used in an open-ended fashion, and thus, should be interpreted to mean "including, but not limited to."

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, quantities, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of 1 to 4.5 should be interpreted to include not only the explicitly recited limits of 1 to 4.5, but also include individual numerals such as 2, 3, 4, and sub-ranges such as 1 to 3, 2 to 4, etc. The same principle applies to ranges reciting only one numerical value, such as "at most 4.5", which should be interpreted to include all of the above-recited values and ranges. Further, such an interpretation should apply regardless of the breadth of the range or the characteristic being described.

The term "adiabatic fast passage" (AFP) (also referred to as "adiabatic rapid passage") as used herein refers to a nuclear magnetic resonance (NMR) technique which uses radio frequency (RF) excitation signals that sweep a range of frequencies or a range of static magnetic field strengths during the signal. The excitation signal is longer in duration as compared to a hard pulse and shorter in duration as compared to a continuous wave. AFP is distinguished from and not considered a "hard" pulse or a continuous wave technique. AFP excitation signals described in embodiments contained herein may refer to a frequency sweep occurring to generate the AFP excitation signal, but it is understood that a sweep of static magnetic field strengths may also be applied. It is also understood that a phase modulated sweep may also be used.

In one or more embodiments, the peak amplitudes of the AFP excitation signal may be substantially constant throughout the signal, for example the peak amplitude may be maintained at a desired value for at least 80%, 90%, 99%, or more of the signal. During the beginning and end of the AFP excitation sweep, the peak amplitudes of the RF frequency may be lower than the desired maximum peak amplitude. This occurs as a natural response function of the RF power transmitter and the response function of the RF coil circuitry, as discussed in further detail below.

In one or more embodiments, the peak amplitudes of the RF signal within the AFP sweep may have a well-defined time dependence as the RF frequency is swept between the upper and lower values of RF frequencies contained within the sweep. For example, when the amplitude is increased, a sinusoidal ramp may be used and when the amplitude is decreased, a cosinusoidal ramp may be used. The excitation signal may have amplitude values less than the desired value at the beginning and end of the signal. In one or more embodiments, both the applied magnetic field $B_1$ resulting from the RF excitation peak amplitudes and the rate of the frequency sweep may be modulated to rotate the effective $B_1$ in a circular arc.

The term "adiabatic fast passage inversion sweep" or "adiabatic fast passage inversion excitation signal" as used herein refers to an adiabatic fast passage sweep that produces an inversion of the magnetization vector resulting from varying the frequency of radio frequency (RF) excitation signal during the sweep such that the frequencies are swept to the Larmor frequency; applying a 180-degree phase shift to the RF excitation signal at substantially the Larmor resonance frequency to reverse direction of the sweep; and sweep the frequency back to the original value. After the phase shift the sweep direction is opposite compared to before the phase shift. For example, the RF frequency at the start of the AFP sweep may begin at a higher frequency than the NMR Larmor frequency and the RF frequency is steadily decreased as the AFP excitation signal length increases. When the RF frequency become substantially equal to the NMR larmor frequency, the RF phase is applied. Subsequent to the phase shift, the RF frequency steadily increases as the AFP excitation signal length continues to decrease until the RF frequency reaches the initial maximum RF frequency at the end of the AFP sweep. The magnetization vector begins aligned with the +z direction (axis) (thermal equilibrium) and rotates through the transverse plane ending up aligned along the −z direction (axis). This results in an inversion. For those skilled in the art, the magnetization along the z direction may commonly be referred to as the longitudinal magnetization. FIG. 1 depicts an AFP inversion excitation signal 100 according to one or more embodiments of the present disclosure. In FIG. 1, the amplitude (in Volts "V") is along the y-axis and time (in milliseconds "ms") elapsed along the x-axis. The RF excitation signal 101 oscillates over time. An oscillation is depicted in region 106. An oscillation travels from maximum frequency 107 along the x-axis to minimum frequency 108 and back along the x-axis to maximum frequency 109. The frequency of oscillations in region 102 are greater than in region 103. A 180 degree phase shift 105 is depicted at the Larmor resonance frequency (2 kiloHertz "kHz"). After the phase shift 105, regions 110, 104 sweep through substantially similar frequencies as applied prior to the phase shift 105. Regions 110, 104 have frequencies substantially similar to regions 103, 102, respectively.

The term "adiabatic fast passage read sweep" or "adiabatic fast passage excitation signal" as used herein refers to an AFP excitation signal that follows an inversion excitation signal after an appropriate delay and provides a sweep of frequencies resulting in a 90 degree rotation of the magnetization vector to an orientation having a z component of substantially zero and lies within the transverse (x,y) plane.

The term "adiabatic fast passage refocusing sweep" or "adiabatic fast passage refocusing excitation signal" as used herein refers to an AFP excitation signal that follows an AFP read excitation signal and provides a 180 degree rotation of the magnetization vector in the transverse plane (x,y) (also referred to as a 180 degree excitation signal).

The term "continuous wave technique" as used herein refers to a technique which sweeps a wide range of frequencies or static magnetic field strengths in a continuous manner. The method of NMR data acquisition using the continuous wave technique relaxes some constraints on the NMR data acquisition technique using an AFP excitation sweep. One example is the rate of the frequency sweep. In the continuous wave method, the rate of RF frequency sweep is slow (less than) relative to the rate of frequency sweep used in an AFP excitation signal.

The term "flat coil" as used herein refers to a coil having a greater extent in two dimensions than the thickness of the coil and oriented proximate a region of interest. The coil is formed from at least one wire path configured to carry a controllable electric current and routed to form a coil and to define an array including at least two parallel elements of the wire. The currents flowing through the parallel wire elements return via wires at the ends or sides of the body, in substantially the same plane as the coil array, to minimize their effects on the coil array at the center of the body. The flat coil may transmit a excitation signal to generate a magnetic field that is parallel to the plane of the coil (and perpendicular to the static magnetic field which may be the Earth's magnetic field) and receive induced signals from a time-varying applied magnetic field generated in the region of interest. The region of interest is located to one side of the flat coil, that is a side of the coil defined by the larger dimensions, and the flat coil can provide a relatively uniform applied magnetic field. In one or more embodiments, the flat coil may be wound with at least two windings such that most of the coil comprises a flat array having a plurality of parallel wire elements so connected that the electrical currents flow in the same coordinate direction in all the parallel wire elements at any given time.

The term "hard pulse" as used herein refers to a high power, short pulse (in time) at substantially the Larmor resonance frequency of the material to be detected.

Figure 1B:
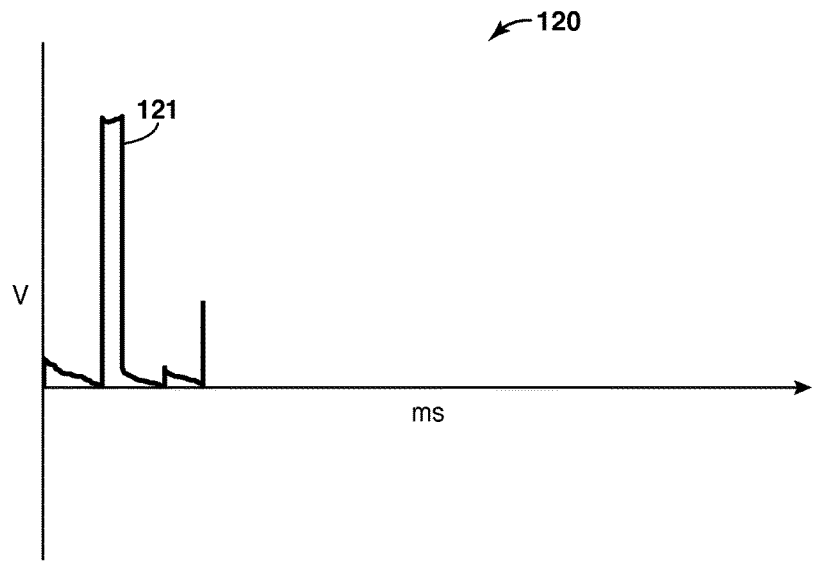
FIG. 1B illustrates a hard pulse excitation signal according to one or more embodiments of the present disclosure.

The term "hard inversion pulse" as used herein refers to a hard pulse that produces an inversion of the magnetization vector resulting from excitation occurring during the pulse of radio frequency (RF) signal at the Larmor resonance frequency. The magnetization vector begins aligned with the +z direction (axis) and rotates through the transverse plane ending up aligned along the −z direction (axis). This results in an inversion. FIG. 1B depicts a hard pulse used for inversion 120. In FIG. 1B, the amplitude (in Volts "V") is along the y-axis and time (in milliseconds "ms") elapsed along the x-axis. The RF excitation signal 121 oscillates during the pulse; however, the envelope of the oscillations is depicted and the particular oscillations are not shown for the sake of clarity The RF excitation signal 121 is depicted at substantially the Larmor resonance frequency (which is approximately 2 kiloHertz "kHz" for protons in the Earth's magnetic field). Each element of the periodic table that is NMR active has a unique gyromagnetic ratio, commonly known as gamma ($\gamma$) which defines the relationship between the NMR Larmor frequency, $2\pi v$, and the applied magnetic field, $B_0$. This fundamental resonance relationship is $2\pi v = B_0$. The v is the frequency of the RF excitation signal.

The term "hard read pulse" as used herein refers to a hard pulse excitation signal that follows an inversion excitation signal and provides a 90 degree rotation of the magnetization vector to orient with substantially zero z component of magnetization such that the vector lies within the transverse (x,y) plane.

The term "hard refocusing pulse" as used herein refers to a hard pulse excitation signal that follows a read excitation signal and provides a 180 degree rotation of the magnetization vector in the transverse plane (x,y) (also referred to as a 180 degree excitation signal).

The term "inversion" as used herein refers to a transformation of the magnetization from its thermal equilibrium state to a non-equilibrium state in which the magnetization vector is oriented 180 degrees (along the −z axis) from the static magnetic field ($B_0$) aligned along the +z direction.

The term "Larmor resonance frequency" as used herein refers to the equation $\omega = \gamma B_0$ (where $\omega = 2\pi v$).

The term "loop coil" as used herein refers to one or more loops of wire having a current traveling the length of the wire in a given direction that may be placed proximate a region of interest within the Earth. Loop coils have a substantially axial applied magnetic field, being perpendicular to the plane of the loop, and therefore, have limited surfaces providing an applied magnetic field perpendicular to the common orientation of the static magnetic field of the Earth.

The term "null time" (TN) as used herein refers to the period of time between the completion of an initial 180 degree inversion and the read excitation signal. The null time is the time at which the $M_z$ magnetization is substantially zero which is the point where the $M_z$ changes from (−) to (+).

The term "excitation sequence" as used herein refers to a set of RF transmitted excitation signals. For example, an inversion RF excitation signal followed by a read excitation signal and one or more refocusing excitation signals.

The term "signal sequence repetition time" (TSR) as used herein refers to the period of time between successive excitation signal sequences applied to a sample region.

The term "substantially", "substantially the same" or "substantially equal" as used herein unless indicated otherwise means to include variations of a given parameter or condition that one skilled in the pertinent art would understand is within a small degree variation, for example within acceptable manufacturing tolerances. Values for a given parameter or condition may be considered substantially the same if the values vary by less than 5 percent (%), less than 2.5%, or less than 1%.

The term "substantially different" as used herein means to include variations of a given parameter or condition that one skilled in the pertinent art would understand is not within a small degree of variation, for example outside of acceptable manufacturing tolerances. Values for a given parameter or condition may be considered substantially different if the values vary by greater than 1%, greater than 2.5%, or greater than 5%.

The term "surface" as used herein refers to a surface of the Earth. The surface of the Earth in the region of interest may obscure visual detection of materials below the surface. The surface may be earthen formation, snow, ice, layer of water or any combination thereof, such as, for example, ice floating in water. In one or more embodiments, the surface includes snow, ice, a layer of water or combinations thereof. In one or more embodiments, the surface includes earthen formation. The term "earthen formation" as used herein refers to the land mass of the Earth, in particular soil, rocks, vegetation, or any combination thereof.

The term "T1 relaxation time" (also referred to as "spin lattice relaxation time" or "longitudinal relaxation") as used herein refers to the period of time required for the magnetization vector of 63% of the excited nuclei to realign with the static magnetic field, $B_0$.

The term "T2 relaxation time" (also referred to as "spin relaxation" or "transverse relaxation") as used herein refers to the period of time required for the excited nuclei to lose phase coherence (dephase) among the nuclei spinning perpendicular to the static magnetic field, $B_0$, such that 37% of the original vector remains.

The term "wire" as used herein refers generally to any electrically conductive pathway, and includes conventional wires but also other known methods of fabricating a pathway for the transmission of electric current.

The present disclosure relates to a method of detecting a material within a region of interest in the Earth. The method may be used to determine and locate the presence of material of interest within the region of interest. The region of interest may contain a first material in the presence of a second material. In one or more embodiments, the first material is a material for detection and the second material is a material for which at least a portion of the NMR signal is to be suppressed (e.g., at least 50% of the NMR signal may be suppressed, at least 75%, at least 85%, at least 90%, or at least 99%, same basis), for example the second material may be water. The region of interest may be under a surface of the Earth and located at least partially in a static magnetic field such as Earth's magnetic field or a magnetic field generated by man-made equipment. In one or more embodiments, the man-made equipment may be one or more additional coils configured to generate a static magnetic field in the region of interest or one or more magnets.

In one or more embodiments, the NMR tool may include a coil. The coil may be utilized from a location proximate to a region of interest. A transportation device may be used to transport a NMR tool including a coil to one or more remote locations. In one or more other embodiments, a coil may be positioned at a particular location (above or below a surface of the Earth) for periodic monitoring of a particular region of interest. In one or more embodiments, the regions to be measured by the coil in an area of concern may be determined in any suitable manner, for example visual inspection or a predetermined pattern (e.g., a grid, etc.). The area of concern may be traversed using a transportation device and a detection method and system according to one or more embodiments described herein to gather data about the presence of the material. In one or more embodiments, the material may be mapped using the data and information obtained from the measurements of the regions of interest in the area of concern. The transportation device may be any suitable device configured to transport the coil to the regions of interest to be measured, for example a land-based vehicle (e.g., a truck, a semi-trailer truck, etc.), a marine vessel (e.g., an icebreaker vessel, floating production storage and offloading vessels, barges, etc.), an underwater vehicle (e.g., a manned or unmanned submersible vehicle), an airborne device (e.g., a rotary wing aircraft, vertical take-off and landing aircraft (VTOL), a lighter-than-air craft, a dirigible (e.g., a blimp), an unmanned drone, or other aircraft that can move over a volume to be detected or hold a position over the volume) or human power. In one or more embodiments, the airborne device may be a VTOL aircraft, for example a helicopter.

For a particular region of interest, the coil may be positioned proximate the region to be measured. The coil may be positioned above the region to be measured or may be positioned under the region of interest, for example when using an underwater vehicle or marine vessel or when placing the coil within the region of interest for periodic monitoring. The coil may be positioned substantially parallel to the surface, substantially perpendicular to the static magnetic field, a given distance from the region of interest or may be positioned in contact with the region of interest.

In one or more embodiments, the coil transmits a radio frequency (RF) excitation signal to the region of interest generating a response in the materials therein. The coil used to send the excitation signal may be of any suitable size. In applications where the coil is to traverse a large area of concern, the coil may have a small footprint, for example having a maximum length of at most 20 meters or at most 10 meters and at least 1 meter or at least 3 meters. The smaller coil size may decrease the effective volume and depth that can be detected as compared to a loop coil having a maximum dimension of 100 meters (which can measure vertical depths of up to 150 meters), but also may make the coil more manageable when mounted on a transportation device. A coil, such as a flat coil may be used to measure an NMR signal at a shallower depth, also known as the "near depth", say of order 1 to 3 m, below the surface of a region of interest. The thickness of the coil may be any suitable thickness, for example at most 10 percent of the extent of the coil (i.e., maximum dimension), or at most 5 percent, same basis. The shape and size of the coil may vary depending on a variety of factors, including the type of coil, desired volume to be measured and the depth to be detected. Other factors may include the transportation device to be employed, weather, presence of ice and the ice conditions, the size of the spill, the type of hydrogen-containing material (e.g., type of oil, type of crude oil, etc.), as well as other factors.

In one or more embodiments, the surface of the region of interest may be water, snow, or ice. In one or more embodiments, the ice may be any of marine ice, freshwater ice, land-fast ice, moving ice, first year ice, multiyear ice, pack ice and combinations thereof. In one or more other embodiments, the surface of the region of interest may be an earthen formation. In one or more embodiments, the materials within the region of interest may be any material capable of excitation by an applied magnetic field (NMR active), for example water, organic materials, inorganic materials, and combinations thereof. The organic material may be an organic contaminant, hydrocarbon oil, such as crude oil, vegetable oil, mineral oil, or fuel oil. The inorganic material may be a radioactive material or other inorganic contaminant. The contaminant material may originate from activities associated with one or more industrial processes.

In one or more embodiments, the system may include a nuclear magnetic resonance (NMR) tool including a coil configured to transmit RF excitation signals, in particular inversion excitation signals, mounted to a transportation device which is configured to receive the NMR tool. The coil may also be configured to receive the signal emitted from the region being analyzed (sometimes referred to in the art as an antenna). In one or more embodiments, the system may include one or more control systems configured to control the transmission of excitation signals; convert the signals received by the coil to digital values; process the digital values; and display the results in a digital display or paper printout. In one or more embodiments, the system may include at least one amplifier configured to amplify the signals, for example an amplifier to amplify excitation signals and a second amplifier to amplify the NMR signals received by the coil.

The method and system of the present disclosure provides improved signal intensity and S/N ratio for detecting material by suppressing the signal from another material in a region of interest in the Earth.

In one or more embodiments, the system may also be used to provide a depth profile. A current within the coil may be varied to transmit excitation signals of different amplitudes. The magnetization rotated into the transverse plane has a maximum signal at some depth, D. For example, a first excitation signal may be transmitted at a first amplitude; one or more signals received by the coil; and the received signals processed to determine the depth of the maximum $B_1$. In one or more embodiments, a second excitation signal at a second amplitude is transmitted; one or more signals received by the coil, and the received signals processed to determine the depth of the maximum $B_1$ for the second depth profile signal to provide a depth profile for the material of interest. Any number of different amplitude excitation signals may be transmitted to provide the depth profile. The pulses may be a plurality of hard pulses.

In one or more embodiments, the method may or may not include pre-polarization of the region of interest. Application of pre-polarization may use the same coil as for transmitting/receiving the RF signals or may use a different coil. The pre-polarization may be of a factor of 2, 3, 4, 5, 6 or more. In one or more embodiments, the pre-polarization factor may be at most 6, or at most 4, or at most 3. The application of pre-polarization can increase the magnetization in the region of interest.

The coil may be any coil suitable for transmitting a RF excitation signal, for example a hard pulse, an AFP sweep or any combination thereof, into a region of interest in the Earth and generating an applied magnetic field. The coil may be of any suitable shape, for example square, rectangular, circular, oval, elliptical, etc. The coil may be of a single loop or a plurality of loops, for example a double loop or a plurality of double loops. A plurality of loops may have loops of substantially the same dimensions, or may have substantially different dimensions. In one or more embodiments, a double loop coil may be substantially in the shape of a "figure 8" which refers to the continuous route of the coil wire in which the wire is passed over itself (without electrical connection at the point of passing) and may define a plurality of double loops, referred to as multi-turn, double loops. The coil size and configuration may also be influenced by the transportation device to be used to collect measurements, the timing, the depth of detection desired, response time, and weather conditions.

In one or more embodiments, the coil may be a loop coil. Loop coils may be of any suitable size depending on the intended region to be analyzed. The loop coil may be an off-the-shelf loop coil or modified off-the-shelf loop coil, such as the NUMIS™ or NUMIS PLUS™ device from Iris Instruments, the GMR™ device from Vista Clara, or may be a fully customized coil or some combination of off-the-shelf and customized components. In one or more embodiments, the loop coil may be a single conductor loop which may be used for both generating the applied magnetic field as well as receiving the NMR signals generated by the material. In one or more other embodiments, the loop coil may be more complex such as a double loop (figure eight) coil. The loop coil may be of any suitable size. In one or more embodiments where the loop coil may be intended to traverse an area of concern, the loop coil may be at most 20 m or at most 15 m. Loop coils can provide measurements at depths comparable to at least the extent (i.e., the greatest dimension) of the coil.

Figure 3:
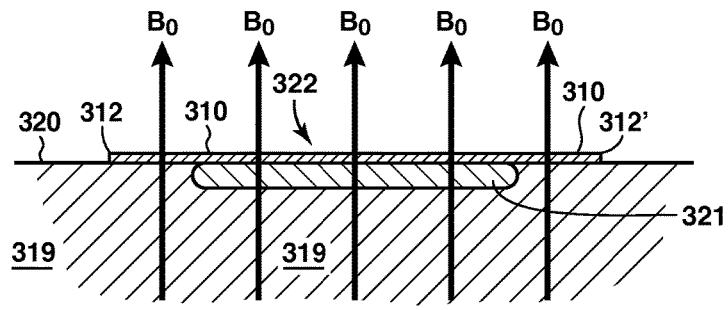
FIG. 3 is an end sectional view of a flat coil system according to one or more embodiments of the present disclosure.

In one or more other embodiments, the coil may be a flat coil. FIG. 3 illustrates a side cross-sectional view of a flat coil positioned proximate a surface of the Earth according to one or more embodiments of the present disclosure. In FIG. 3, the coil assembly body 310 has thereon an electrically conductive pathway, such as a routed wire, arranged thereon to provide a coil 322 for generating magnetic field adjacent to the body 310. In one or more embodiments, the current in the wire pathway of the coil 322 may be controllably time-varied, according to known NMR techniques. The coil 322 on the body 310 function to generate a magnetic field for evaluating, via NMR processes, an area 321 within an upper portion of the region of interest 319 beneath the surface of the Earth 320. The static field $B_0$ is depicted by the large upwardly oriented directional arrows and is generally perpendicular to the plane of the coil body 310. When the static field of the Earth is more horizontally inclined as found near the lower latitudes, the coil may be oriented so the applied magnetic field generated is perpendicular to the static field. The wires return current from the coil 322 to current sources and other electronics "off" the body 310 and known in the NMR arts. The wires may be placed at the sides of the body assembly, that is, concentrated in substantially the same plane as the coil's working array, but near the edges 312, 312' of the body 310.

Still referring to FIG. 3, the flat coil body 310 is positioned on or very close to, and substantially parallel to, the surface 320 (e.g., the surface of the Earth) to detect a material near the surface. The coil body 310 may be oriented so that the static field $B_0$ is geometrically substantially perpendicular to the planes of the coil 322 and of the surface 320. The surface 320 may be the surface of the Earth, and the static field $B_0$ may be the Earth's magnetic field, harnessed to perform the NMR method.

Figure 4A:
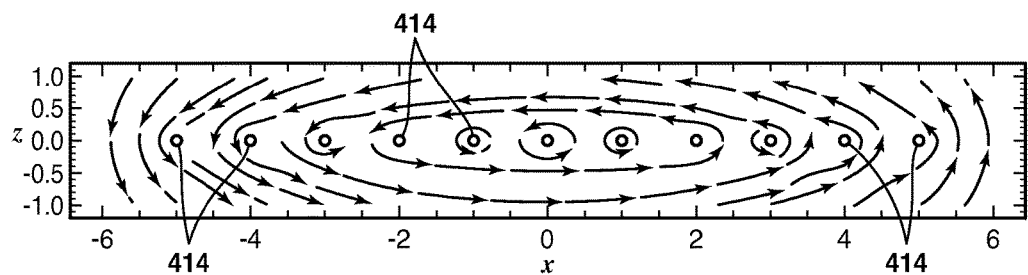
FIG. 4A is an end view diagram of several parallel wire elements as may be included in a flat coil array according to one or more embodiments of the present disclosure.

FIG. 4A illustrates wire windings of a flat coil according to one or more embodiments of the present disclosure. FIG. 4A depicts a set of wire elements 414 that are substantially parallel to each other, with the currents flowing in the same direction. In FIG. 4A, the current in each wire element 414 flows out of the plane of the paper, to generate an applied magnetic field depicted by the directional arrows of the figure. The inter-element spacing of the wire is depicted as substantially equal. A rectangular array of N>>1 evenly spaced wires may be used. In one or more embodiments, the inter-element spacing of the wire windings may be substantially equal to or less than the distance (measured perpendicularly) from the flat coil array to the (approximately parallel) planar area 421 in the region of interest 419. The area 421, therefore, may be characterized by a simple shape—a generally uniform region parallel to the plane of the coil 422, as indicated in FIG. 3.

In FIG. 4A, N=11 and the gap between adjacent wire elements is one meter, so the entire dimension of the coil array is 10×10 meters. In this geometry, the magnetic field generated by each wire element 414 (eleven wire elements seen in FIG. 4A, six are labeled) is a circle around each element, close to the wire. Wire element 414 is a discrete wire, or alternatively a grouped plurality of wires. At greater distances, the horizontal component of the field becomes increasingly uniform, while the vertical components of the field approach zero (except near the edges of the array). The field strength variations caused by the presence of discrete currents disappear for distances exceeding about one-half of the inter-element spacing, as indicated by FIG. 4A.

This reasoning holds for arrays of infinite size, but there are edge effects to contend with for real arrays that are of a finite size. One way to conceptualize an edge effect is to consider contributions to the field in a plane above the coil. There is a major contribution from the nearest wire (or nearest two wires if the point is halfway between two wired) as well as decreasing contributions from more distant wire elements. For a point above the plane of the coil but at the edge of the array, i.e., above the last parallel wire element, an entire half plane of wire elements, that otherwise would contribute to the field, is missing so that the net field at that point is significantly weaker than at points farther from the edge. The field strength drops off in the other direction, i.e., along the wires, for a similar reason. The drop-off in field perpendicular to the wire direction can be compensated for, if desired, by either increasing the currents in the wire elements nearer the edges of the coil array, or by making the gaps between the wire elements smaller (e.g., progressively decreasing separation distances) towards the edges of the coil array. Similarly, the drop-off in the field parallel to the wire elements can be compensated by decreasing the distances of separation between adjacent elements towards the edges of the array.

Figure 4B:
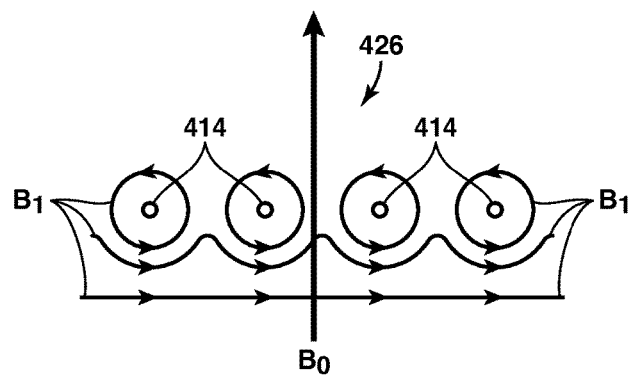
FIG. 4B is an end view, enlarged in relation to FIG. 4A, showing a four wire element portion of the flat coil array according to one or more embodiments of the present disclosure.

FIG. 4B illustrates the current formed in an enlarged portion of the flat coil array of FIG. 4A. FIG. 4B shows how four generally straight, substantially parallel wire elements 414 in a portion of a coil array 426 generate RF fields $B_1$ proximate to the array that are substantially parallel to the plane of the coil, and simultaneously perpendicular to the wire elements 414. In FIG. 4B, the wire elements 414 are depicted in a cross-sectional end view, and the current in every wire is flowing "out" of the plane of the paper. A person skilled in the art would readily appreciate that for the sake of illustrative simplicity only four wire elements 414 are shown in a portion of a coil array 426 in FIG. 4B. In one or more embodiments, the number of parallel wire elements 414 may be large, such as in the hundreds or more, depending on the particular application. In FIG. 4B, the wire elements of a flat coil array 426 are disposed upon a coil body in electrical series, but in one or more other embodiments may be connected in electrical parallel, also a matter of design choice depending upon the intended use. If in series, the system is electrically equivalent to a solenoidal coil, where the coil array corresponds to a portion of the solenoid that is made flat and the currents are constrained to be the same in each wire element. A parallel connection between wire elements results in smaller inductance and resistance, and the current distribution can be easily adjusted.

In FIG. 4B, the directions of the generated magnetic field $B_1$ are suggested by the directional arrows associated with the field lines. Extremely close to each wire element 414, the field lines are concentric about the axis of the corresponding wire element. However, as suggested in the FIGS. 4A and 4B, at a particular distance below/above the plane containing the coil array 426, the effective combined field generated by the overall array 426 approaches uniformity. Accordingly, the flat coil greatly ameliorates the non-homogeneity of the coil's RF excitation field $B_1$, which can be a hindrance for unilateral NMR.

Figure 5:
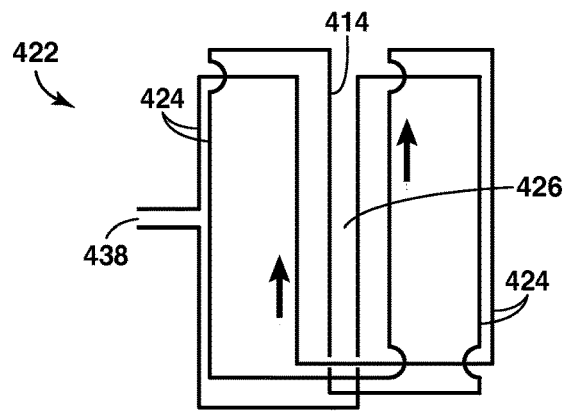
FIG. 5 is a schematic diagram illustrating a wire routing scheme for a flat coil according to one or more embodiments of the present disclosure.

Further illustration of a flat coil is provided by reference to FIG. 5, which shows diagrammatically one possible way to wind an electromagnetically equivalent flat coil 422 with four parallel wire elements comprising a central coil array 426. Such flat coils 422 have the property to reject long-range magnetic interference and can be designed and fabricated with practically any even number of parallel array wire elements 414, 414' in the coil array 426. In the embodiment of FIG. 5, the coil array 426 includes parallel wire elements with equal currents that flow in the same direction at any given time. FIG. 5 depicts the current flow in each of the four central parallel wire lengths being from the bottom to the top of the figure, as suggested by the directional arrows. Return wire portions 424 are located relatively remotely away from the array 426, such that the complete coil 422 forms a magnetically balanced circuit that cancels far-field magnetic interference. One of the loops in coil 422 includes leads or terminals 438 which operatively connect the coil 422 with the NMR electronics system 440 according to generally known principles. The figure shows a two-turn, figure-eight wire route, with four parallel array wire elements 414 in the center forming the working portion 426 of the flat coil. The portion of the coil 422 that generates the desirably uniform flux parallel to the coil plane thus is defined by the central section 426 having the array wire elements 414, 414' all carrying current in the same direction. In one or more embodiments, a magnetically equivalent flat coil also with four parallel wires in the center can be wound by first winding the two rectangular loops on one side, for example the left side, and then winding two rectangular loops on the other side. Even though the magnetic field generated per unit current in the loops is the same, this coil uses significantly less wire. The present disclosure covers all such equivalent arrangements of coils that generate the same pattern of magnetic fields with the same electrical currents flowing in the coils.

Figure 6A:
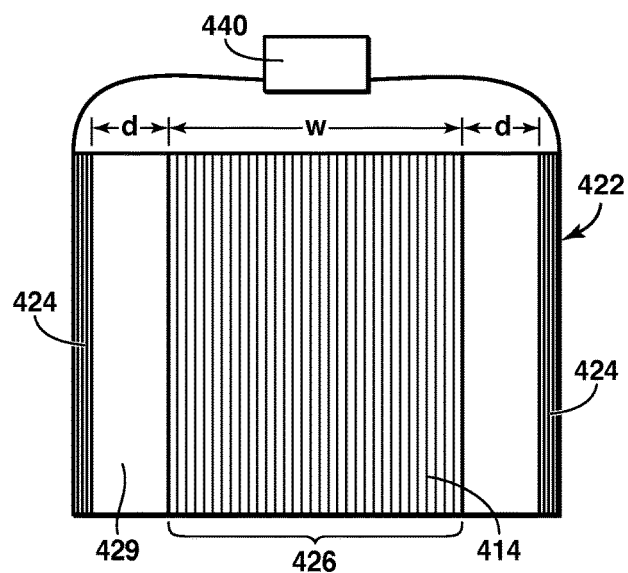
FIG. 6A is a top or plan view of an overall flat coil body and coil in accordance with one or more embodiments of the present disclosure.

FIG. 6A illustrates a flat coil in accordance with one or more embodiments of the present disclosure. Flat coil 422 includes many additional return wire portions 424 to return the current from the large plurality of generally parallel wire elements 414 of the coil array 426. The coil array 426 is disposed upon a coil mount body 429. The mount body 429 may be fabricated from any suitable, substantially non-electrically-conductive and nonmagnetic, material able to provide structural support and integrity to the overall flat coil apparatus 422 and compliment any transportation device which may be used. Shown in FIG. 6A to be generally rectangular, the mount body 429 may in one or more other embodiments define other shapes and profiles. Current return is required regardless whether the array wire elements 414 in a coil array 426 are connected in series or parallel. The current return wire portions 424 are situated upon the mount body 429 to be substantially co-planar with the coil array 426 of parallel wires. Also, as indicated in FIG. 6A, the current return wire portions 424 are removed from the margins of the coil array 426 by a return separation distance d. In one or more embodiments, the distance, d, may be at least twenty percent (20%) of the width dimension w of the coil array 426 of parallel wires. In one or more embodiments, the array wire elements 414 may be uniformly spaced apart within the coil array 426, as shown in FIG. 6A. In one or more other embodiments (not shown), the array wire elements 414 proximate the side or edge of the coil array 426 may be spaced apart at a distance less than the array wire elements 414 within the interior of the coil array 426 proximate the center of the coil array 426, or the array wire elements 414 may be disposed in parallel groups or non-parallel groups, the groups being spaced within the coil array 426. A group may include two, three or more array wire elements 414. For a coil as shown in FIG. 6A, the return wire portions 424 may be closely bundled together. In one or more other embodiments, the return wire portions may be spatially distributed to alter their effects on the main array 426, or to generate excitation signals from them to add to the excitation signals generated by the main coil array 426.

Still referring to FIG. 6A, the current in each of the numerous array wire elements 414 comprising the coil array 426 flows in the same direction, i.e., the current in the array 426 is either all "down" or all "up" at any given instant, but may be reversed at any other instant in time; the current flows in the opposite direction in the bundles of return wires 424. The electrical connections between the array wire elements 414 and the bundles 424 are "behind" the mount body 429 in FIG. 6A (not shown).

Figure 6B:
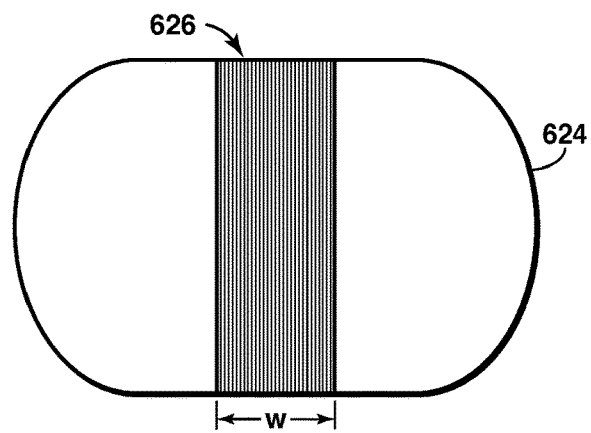
FIG. 6B is a top or plan view of a flat coil in accordance with one or more embodiments of the present disclosure.

In one or more embodiments, the flat coil of FIG. 6A may be modified such that the width dimension, w, of the wire array is less than depicted in FIG. 6A and the sides with the return wires are curved, having at least one radius of curvature less than infinity along a major portion of the sides. It is understood with respect to the present disclosure that the radius of curvature for a linear surface is infinite. FIG. 6B depicts a coil having a linear central coil array portion 626 and curved sides include return wires 624 similar to a "double D" gradiometer design. The wire elements in the coil array 626 are not shown for the sake of simplicity.

It should be apparent to a person skilled in the art that, while the coil 422 and substrate body 429 have been described herein above as being generally flat with a completely rectilinear substrate body, other shapes and profiles of the body and coil are within the scope of the present disclosure, for example to adapt the shape of the coil 422 (and any substrate body) to complement or substantially correspond to the contour or profile of the surface of the region under examination, which may include the use of a supple material for the substrate body such that the substrate body may flexibly conform to a non-planar contour of a surface of the region of interest.

It also shall be apparent that the use of a substrate body may be optional. In certain embodiments of an apparatus in accordance with this disclosure, the parallel wire elements 414 defining the coil array 426 may be joined in spaced relation to each other by one or more flexible or rigid relatively narrow straps, cords, or brackets, disposed laterally across the array (not parallel with the array wire elements 414).

An advantage of the flat coil apparatus as shown in FIGS. 6A and 6B is that it is ideal for quadrature operation that will result in a √2 improvement of the signal to noise (S/N) ratio over a single coil. Such a configuration eliminates the Bloch-Siegert shift that may occur and can provide a more efficient transmission operation and receiving operation. A single NMR coil can generate only one component of the rotating field; in contrast, two co-planar flat coils can be stacked and oriented orthogonally to each other to form an NMR coil that can be operated in quadrature with a 90 degree phase shift between them and generate a rotating magnetic field. Such a quadrature operation results in increased efficiency for both transmission and reception. This is a known effect in NMR but not often used, for example, with the commonly used solenoids, due to geometrical constraints. The flat coil design of FIGS. 6A and 6B and other similarly related embodiments are capable of taking full advantage of quadrature transmission and detection because of the favorable geometry.

In one or more embodiments, the plurality of parallel array wire elements defining the flat coil array may be spread out at uniform intervals. When the array wire elements are uniformly closely-wound or layered evenly and the coil positioned upon a surface of the Earth, the area within the region of interest (sensitive region) begins at the flat coil and culminates at a depth below the surface of the Earth that depends on other non-geometrical factors. Multiple layers of parallel wire elements in the flat coil array may be beneficial.

In one or more other embodiments, the wire elements of the flat coil array may be bundled in groups, depending upon the depth profile of the area to be analyzed for a particular region under examination. As a result, the area to be measured within a region of interest beneath the surface begins at a selected depth distance below the bundled groups approximately equal to the separation distance between the groups. Thus, the spacing arrangement between wire elements of the flat coil array may be set to establish the perpendicular distance between the coil and the nearest portion of the area to be measured.

In addition to accomplishing efficient NMR transmission and detection, the figure-eight geometry of the circuit of the flat coil apparatus attenuates far-field magnetic interference; however, large flat coil applications may be inconvenient or impossible to mitigate fully against such interference. In one or more embodiments, a flat coil may be configured to have adjustable relative magnetic fluxes in the two halves or loops of the flat coil circuit in order to minimize the interference pickup that may vary according to nearby objects such as magnetic rocks and magnetic metals that deflect the magnetic field. The magnetic flux may be adjustable either mechanically or electrically. Mechanical adjustment may include adjusting the wire positions. Electrical adjustment may include using conductive plates of copper, aluminum or other non-magnetic electrical conductor that is configured to direct the flux, as indicated in FIG. 7.

Figure 7:
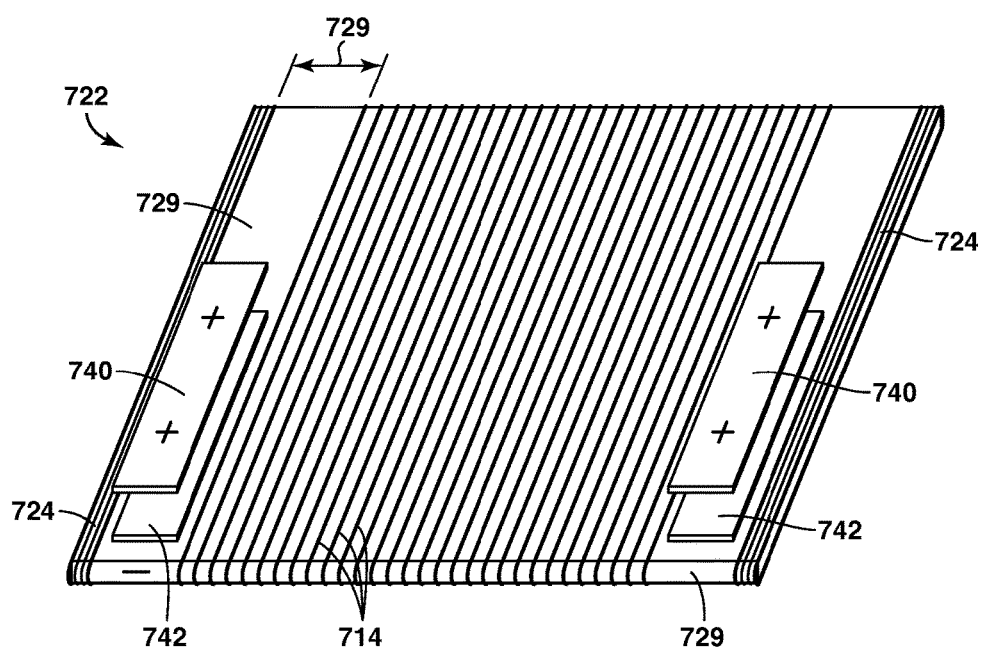
FIG. 7 is a perspective view of a flat coil in accordance with one or more embodiments of the present disclosure.

Referring to FIG. 7, an example of adjustable electrically conducting plates 740, 742 that may be manipulated to steer magnetic flux differentially in the two halves of the flat coil 722 is provided. A top plate 740 and a bottom plate 742 are in parallel flush contact, and upon the body 729 on both sides of the coil array 726 and between the coil array and the return wires 724. The conductor plates 740, 742 have substantially the same size and shape, so that when stacked vertically they share about the same plan profile. The degree of overlap between the conductive plates may be controllably variable from about 100% to nearly zero; in the latter case, the vertical plan area covered by the two plates is about twice the area of the two when vertically stacked. Each bottom plate 742 is attached to the substrate body 729. The top adjustable plate 740 is slidably mounted, by any suitable mechanism such as by pins-in-slots, in flush sliding contact upon the bottom plate 742, so as to permit the top plate 740 to be controllably shifted (and then temporarily locked in place) in either or both of two dimensions in relation to the bottom plate 742. The controlled sliding movement of top plate 740 occurs while it remains in electrical contact with the bottom plate 742, so that the total conducting area between the plates may be adjusted. By sliding the top plate 740 upon the bottom plate 742, an operator may direct the coil flux. One pair of adjustable plates 740, 742 may be used on each side of the coil array 726, although in one or more other embodiments a single pair may be used on the side of the array through which the larger flux passes. The area of overlap between plates 740, 742 may be controllably adjusted to minimize the magnetic interference. In one or more embodiments, electric adjustment may include active circuitry that balances the interference reception in the two halves or loops of the overall coil.

In one or more other embodiments, the system may be used where the Earth's magnetic field is not vertically oriented with the surface of the region of interest. In such applications, a coil can be placed "along" the Earth's magnetic field with the parallel wire elements of the coil array also placed along the Earth's magnetic field, i.e., in a north-south direction so that the applied magnetic field generated would be in an east-west direction.

Figure 20A:
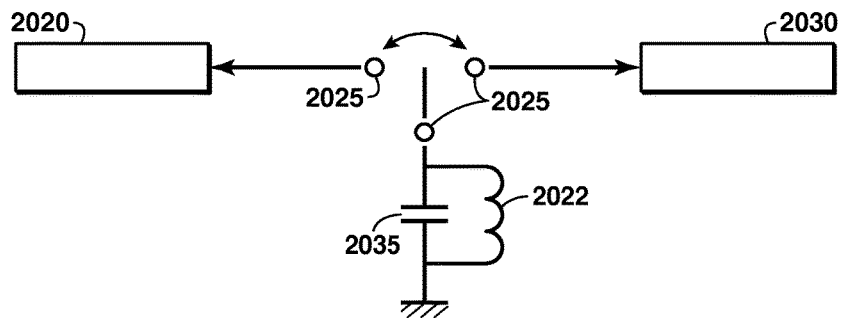
FIGS. 20A-20C illustrate a system for detecting a material using an adiabatic fast passage excitation signal in accordance to one or more embodiments of the present disclosure.
Figure 20B:
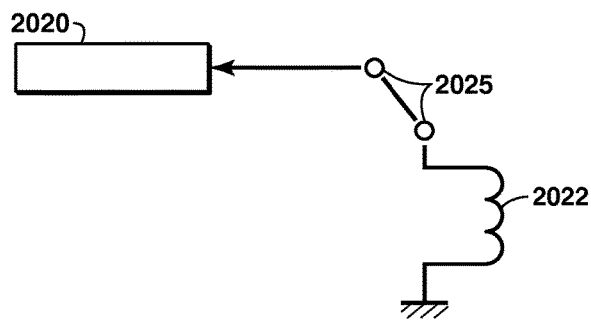
Figure 20C:
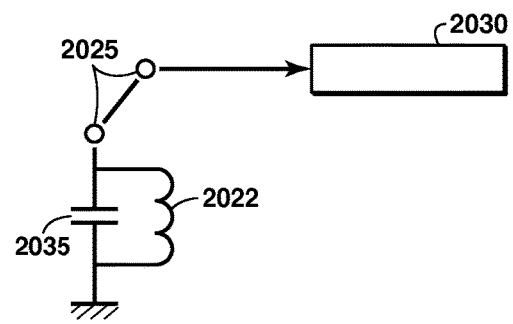

In one or more embodiments, the coil may be configured to be connectable to standard NMR circuit(s). In one or more embodiments, the coil may be tuned by combining the coil with a capacitor to form a resonant circuit. Such tuning circuits are generally known in the art. In one or more embodiments, broadband coupling during transmission of excitation signal may be achieved by having the coil be a part of an unmatched LC parallel resonant circuit, where L is the inductance and C is the capacitance. Such a resonant circuit represents a large impedance so that a transmitter, having a much lower output impedance, can drive the coil as an untuned device, i.e., a broadband device. When the resonant circuit is disconnected from the transmitter and connected to the receiver with a much higher impedance than the transmitter, the coil acts as a part of a resonant circuit, i.e., now the system is in a narrowband mode of operation to receive NMR signal from the detection region. The coil in the broadband mode has a low Q factor compared to the coil in the narrowband mode (having a greater Q factor). As a result, a frequency sweep excitation is possible during transmission and the coil and the capacitor together can operate as a narrowband circuit during the reception mode of operation of the system. FIG. 20A illustrates a certain system including a coil 2022, transmitter 2020, receiver 2030, tuning capacitor 2035, and switches 2025. The switches may be any suitable switches to connect/disconnect the connection between the coil and transmitter or receiver, for example a reed relay or a solid state relay. FIG. 20B illustrates the system of FIG. 20A in the transmit mode and FIG. 20C illustrates the system of FIG. 20A in the receiving mode. In one or more other embodiments, a coil may be operatively connected to a transmitter to provide the broadband device and another coil may be operatively connected to a receiver to provide the reception device. The coils may be substantially similar coils or they may be substantially different coils. These certain systems are particularly well suited for transmitting an AFP excitation signal with or without the suppression of a second material present in the region of interest. In other words, this system may be used to transmit an AFP read excitation signal to detect a material within a region of interest (e.g., water within earthen formation).

In one or more embodiments, the area within the region of interest (sensitive region, inversion region, and/or detection region) to be analyzed may be a substantially flat layer near the surface that is approximately the same size or greater as the flat coil array, and parallel to the plane of the coil. The flat coil is well suited for Earth's field NMR of flat samples, such as a shallow region of the Earth's subsurface whose content is to be evaluated. The use of a flat coil beneficially results in uniform, and therefore efficient, NMR sensitivity providing in an optimal signal-to-noise (S/N) ratio from a region of interest near the surface of the Earth. In contrast, loop coils do not present uniformly sensitive profiles that correspond to the dimensions of the coil and, thus, in certain areas in the region of interest result in comparatively poor S/N ratios. A loop coil has high sensitivity near the loop wire, but much lower sensitivity farther from the loop—such as towards the center of the loop, so that it is not ideally suited for detecting a material in a region of interest at a depth that is closer to the coil than approximately one half of the extent (e.g., maximum dimension) of the loop. However, a loop coil may be suited when detection of a material in a region of interest is at a depth that is no closer to the coil than approximately one half of the extent (e.g., maximum dimension) of the loop. This is due to the fact that the magnetic field decreases with distance from a current-carrying wire in such a way that in a loop the field is relatively uniform only at positions where the relative distances to the wire(s) are similar.

In one or more embodiments, the depth of measurement of the flat coil may be tuned in at least two ways. In a first mode, the spacing distances between the wire elements of the coil array may be set to be substantially equal to the closest distance to be measured in the region of interest. In a second mode, the output excitation signal of the NMR device can be changed to adjust the distance to the depth.

Figure 8:
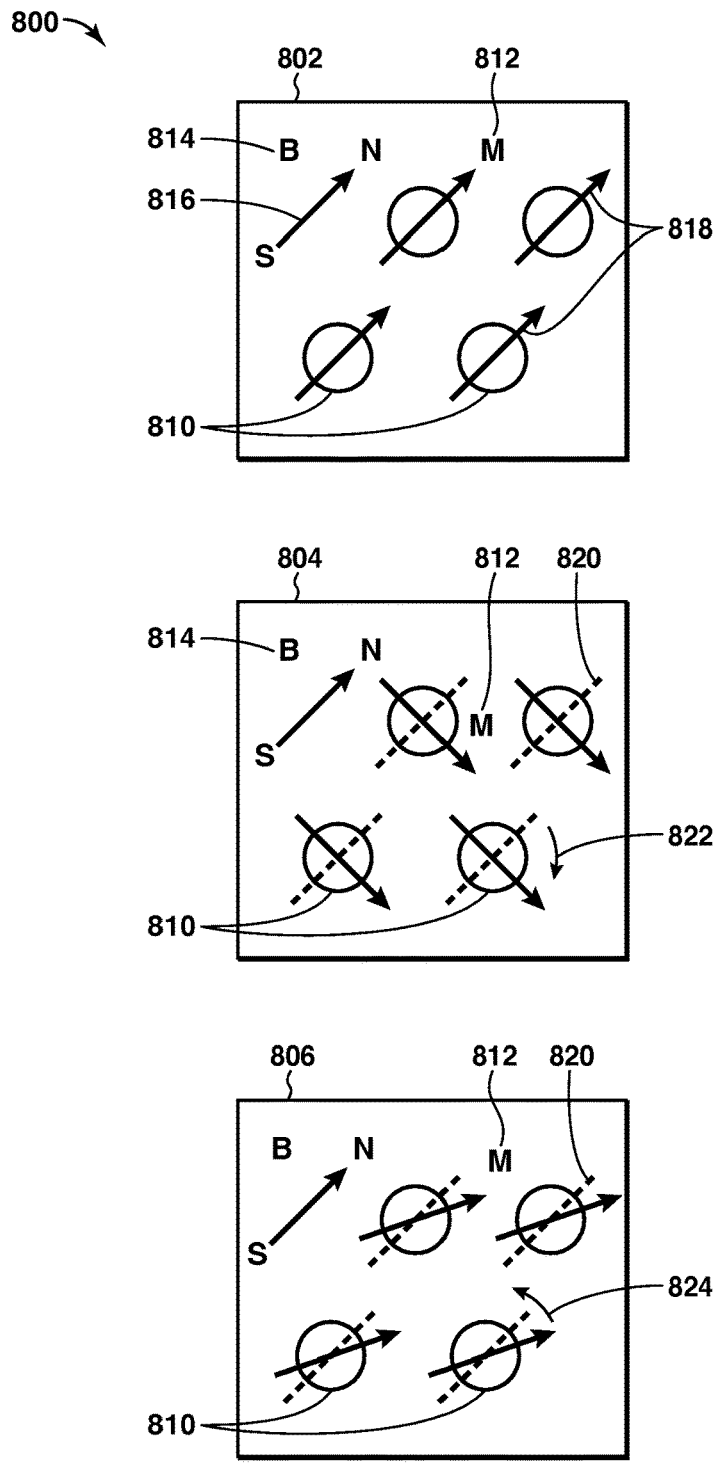
FIG. 8 illustrates a simplified, two-dimensional display of classical nuclear magnetic resonance detection process.

FIG. 8 illustrates an exemplary, simplified, two-dimensional display of the steps of a classical nuclear magnetic resonance detection process 800. The process 800 includes an initial or equilibrium state 802, wherein a plurality of nuclei 810 have a magnetic moment 812 having a heading 818 and a static magnetic field with a magnitude 814 and an orientation 816. In the initial state, the heading 818 of the magnetic moment 812 is aligned with the orientation 816 of the static magnetic field. The second state may be termed the disturbed or excitation state 804. In the disturbed state 804, a radio frequency (RF) excitation signal (e.g., apply an external electromagnetic field) is applied to the nuclei 810, and the magnetic moments 812 rotate, move, or process 822 from their equilibrium orientation 820. The third state may be termed the response or measurement state 806. In the response state 806, the RF excitation signal is terminated and the magnetic moments 812 evolve while processing 824 around the static field to generate a detectable NMR signal. Certain characteristics of the resulting NMR signal are a function of the physical and chemical environments of the nuclei.

For all NMR methods, the combination of the magnetic field and frequency of the excitation signal may be carefully selected to satisfy the "resonance condition", i.e., the relation $\omega=\gamma B_0$ where w is the angular frequency, known as the Larmor frequency, $B_0$ is the strength of the static magnetic field 814 and $\gamma$ is the gyro-magnetic ratio of the proton or nuclei. The gyro-magnetic ratio $\gamma$ has a specific value for each type of nucleus 810, and hence the Larmor frequency is a physical property of the nuclei 810. By selecting the appropriate Larmor frequency, one can decide which nuclei will be detected or investigated. The Larmor frequency referred to in the present disclosure, with a value of approximately 2 kHz for protons in the Earth's magnetic field, is equal to $\omega/2\pi$. The intensity or magnitude of induced transverse magnetization, Mx,y(t), is monitored as the protons 810 in the molecules first diphase, i.e., lose their alignment to form the magnetization vector, then return to thermal equilibrium 806. The first time dependence generally follows an exponential decay:

$$M_{x,y}(t)=M_0 \exp(-t/T_2) \qquad (1)$$

In Equation 1, the initial amplitude, $M_0$, at t=0 is proportional to the concentration of molecules within the detected volume and $T_2$ is the transverse relaxation time of the material of interest. The amplitude Mx,y(t) is detected as a decaying voltage in a radio frequency receiver coil, such as those shown in FIGS. 12 and 13. When multiple types of molecular environments (e.g. fluids) are present, it is possible that each fluid will have its own characteristic relaxation time, $T_{2i}$, which is associated with a magnetization, $M_{0i}$. In this case, the total transverse magnetization detected for the bulk fluid will be:

$$M_{x,y}(t) = \sum_i M_{0i} \exp(-t/T_{2i}) \qquad (2)$$

Equation 2 also describes the time evolution of the transverse magnetization for complex fluids such as a liquid petroleum material (e.g., oil). Petroleum is comprised of a very large number of hydrocarbon molecules 810, which are each described by a characteristic NMR relaxation time, $T_{2i}$. In such complex molecules 810, the relaxation times may be substantially the same for each molecule found in the fluid such that the substantially same relaxation time decay profile is observed. In such circumstances, the material may be treated as a single material.

In one or more embodiments, the detection method and system may be applied to a region of interest containing a plurality of materials. In one or more embodiments, the materials may include a first material and a second material. The relaxation time of the first material (e.g., spin lattice T1 relaxation time) may be significantly shorter than the relaxation time of the second material (e.g., spin lattice T1 relaxation time). In one or more embodiments, the second material may be water and the first material may be one or more of an organic or inorganic material. The organic material may include an oil. In one or more embodiments, the spin lattice relaxation time of the organic materials may be less than one half of the spin lattice relaxation time of the second material, for example less than 40 percent, same basis. In one or more embodiments, the second material (e.g., water) may be present in a greater quantity within the region than the oil, for example present in a quantity of greater than 50 percent by volume (% v), greater than 75% v, greater than 90% v, or greater than 99% v, same basis. The below description may refer to embodiments for detecting oil in water; however, no such limitation is intended. Other combinations of materials may be used which have sufficiently different relaxation times between the materials present, for example a contaminant material in water or contaminant material in an organic bulk material.

In the analytical applications of NMR, where measurements are made in strong, homogeneous magnetic fields, the NMR signal of protons in water are distinguished from those of protons in other liquids, such as hydrocarbons, by observing small frequency differences in the resonance frequencies. However, when operating in the low RF frequencies (e.g. about 2 kilo Hertz (kHz)) required to measure the NMR signal using the Earth's magnetic field (as the static field), these frequency differences may be too small to detect a distinguishable difference in the materials in the resulting spectral display. The presence of the second material may affect the accuracy of measurements of the first material, for example by generating an NMR signal from the second material which masks a potential NMR signal from the first material. This could result in an interpretation of the NMR measurement which is known as a false positive measurement. The presence of the second material in excess compared to the first material(s) may result in the spectral band of the second material subsuming the spectral band of the first material and any other material(s). In such embodiments, there is a desire to be able to suppress the signal of the second material to differentiate signals at the low frequency required to measure the NMR signal in the Earth's magnetic field. Although described as a first material and second material, no such limitation is intended. It is within the scope of the present disclosure that one or more additional materials may be included whether for detection or suppression depending on many different factors, for example the relaxation times in relation to the first and second material.

In one or more embodiments, an AFP excitation signal sequence may be used according to FIG. 9A. A first AFP inversion excitation sweep 901 is transmitted by the coil, a null time 902 is observed, a first AFP read sweep 903 is transmitted, and a signal detection period 904 observed. During the AFP inversion excitation sweep, the 180 degree phase shift 905 in RF signal 921 occurs at the Larmor frequency of substantially 2 kHz. During the AFP inversion excitation, greater frequency excitation may be applied at the beginning of the sweep denoted by region 906 followed by region 907 of lower frequency signal prior to phase shift 905. Regions 909, 908 are similar to regions 906, 907 respectively. In FIGS. 9A and 9B, the number of oscillations in the AFP excitation signals have been reduced for the sake of simplicity, although any number of sufficient oscillations may be applied. The number of oscillations applied during an AFP excitation signal is constrained by the desired length of the signal since at a given amplitude an oscillation takes a certain period of time to complete. The initial magnetization vectors for water and oil in the +z direction ($M_z$) are depicted as 910, 911, respectively. The magnitude of magnetization vector 910 is much greater than 911 representing the greater quantity of water present in the region of interest. At the end of the AFP inversion excitation, the magnetization vectors for water 912 and oil 913 are inverted (lie only the −z direction).

The frequency sweep during the AFP inversion excitation signal may be any suitable sweep sufficient for inversion of the magnetization vectors (substantially aligned with the negative (−) z axis) of the materials present in the inversion region for measurement.

In one or more embodiments, the rate of frequency sweep during the AFP inversion sweep occurs at a sweep rate that produces a constant rate of rotation of the magnetization as described in Journal of Magnetic Resonance, volume 66, pages 470-482, 1986 by C. J. Hardy, W. A. Edelstein and D. Vatis, for example a hyperbolic tangent curve.

Figure 10:
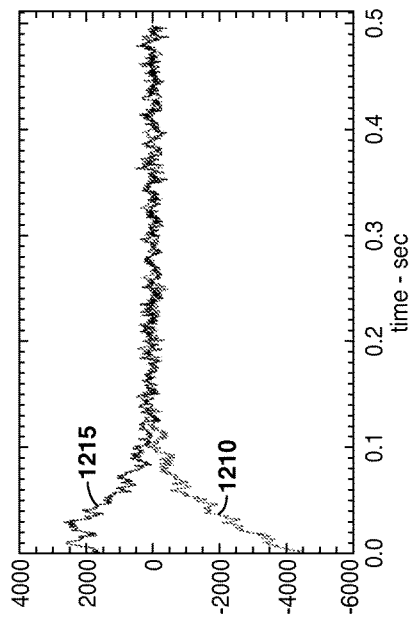
FIG. 10 illustrates an adiabatic fast passage inversion excitation signal in accordance with one or more embodiments of the present disclosure.
Figure 11:
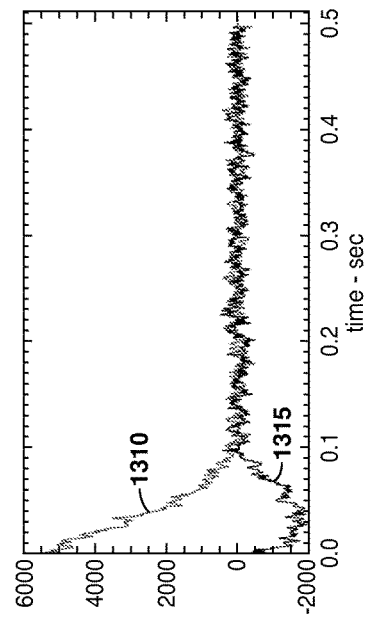
FIG. 11 illustrates an adiabatic fast passage to resonance and return to the origin.
Figure 12:
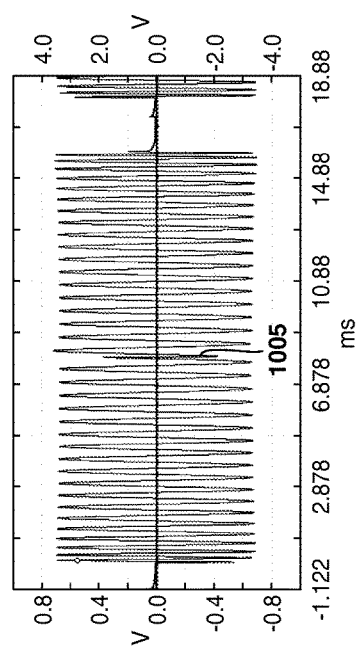
FIG. 12 illustrates the free induction decay signal of FIG. 10 in accordance with one or more embodiments of the present disclosure.
Figure 13:
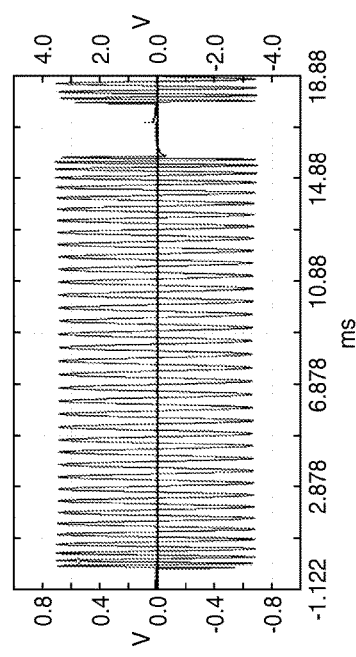
FIG. 13 illustrates the free induction decay signal of FIG. 11.

FIG. 10 illustrates an AFP inversion waveform depicting the 180 degree phase shift 905 at substantially the Larmor frequency of 2 kHz. FIG. 11 illustrates an AFP waveform without a phase shift before the return to the original frequency. FIG. 12 illustrates the signal detected after the AFP inversion excitation of FIG. 10 and FIG. 13 illustrates the signal detected after the AFP non-inversion excitation of FIG. 11. The darker traces, 1215 and 1315, represent components of magnetization that lie along one axis and the lighter traces, 1210 and 1310, represent components that lie along another axis that is orthogonal to the first. As shown in the figures, the inversion reversed the signs of both components, light and dark, as expected.

Referring to FIG. 9A, as may be seen, the magnitude of the magnetization vectors in the z direction $M_z$ decrease during null time 902. The magnetization vectors $M_z$ representing oil 913, 915, 917, 919 decrease in magnitude much faster than the magnetization vectors $M_z$ representing water 912, 914, 916 such that the oil has returned to equilibrium state prior to the water $M_z$ vector reaching the zero axis 924.

Once water's magnetization vector $M_z$ reaches substantially zero, an AFP read excitation signal may be transmitted to the region of interest. The AFP read excitation signal may be adjusted such that the detection region does not substantially exceed the inversion region. By transmitting the AFP read excitation when the water magnetization vector $M_z$ is substantially zero, the water signal is suppressed after the AFP read excitation. This is due to the fact that the read excitation either rotates the water magnetization vector out of the transverse (x, y) plane towards the negative (−) z axis (not shown) or there was no transverse water magnetization to rotate; thus, no signal is detected since signal detection occurs in the transverse (x,y) plane. Signal detection period 904 depicts magnetization vector $M_{x,y}$ 920 for oil and no magnetization vector $M_{x,y}$ for water. The RF excitation 922 during the AFP read signal has a region 925 of higher frequency signal and a region 926 of lower frequency signal. Since a 90 degree rotation of the magnetization vector from thermal equilibrium is desired for the read sweep, the sweep is terminated at the Larmor frequency.

Figure 19:
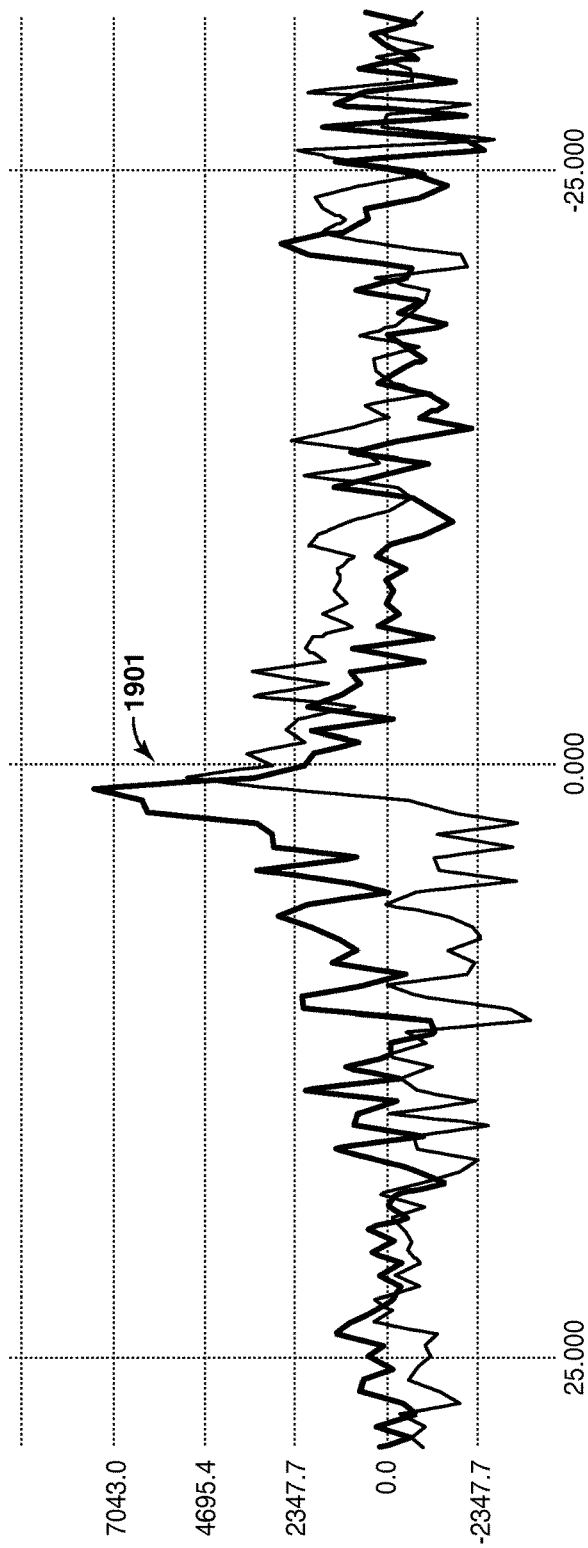
FIG. 19 is an illustration of a spectral display showing the signal of oil and the suppression of water signal in accordance with one or more embodiments of the present disclosure.

Still referring to FIG. 9A, signal detection period 904 illustrates the free induction decay (FID) signal of oil 923 received by the coil. As shown in FIG. 19, the oil signal 1901 may be obtained without the interference of water. In one or more embodiments, the excitation sequence may additionally include one or more refocusing excitation signals (not shown). These RF refocusing excitation signals generate a spin echo in the transverse plane and these spin echoes are detected as NMR signals by the RF coil. An initial refocusing excitation signal may follow the read excitation signal at a time t and subsequent refocusing excitation signals may be applied at successive time periods of 2τ. The one or more refocusing excitations may be hard refocusing pulses. Additionally, in one or more embodiments, the amplitude of the second RF read excitation signal may have a maximum amplitude value less than the amplitude of the first inversion excitation signal.

Although the embodiment of FIG. 9A is described as using a sequence of AFP excitation signals with respect to detecting oil in water, the present disclosure is not intended to be so limited. A hard pulse may be utilized for one or more of the AFP read excitation signals or AFP refocusing excitation signals. Hard pulses have superior depth resolution and can deal with very short T2 signals. As discussed with respect to FIG. 2, an AFP excitation signal beneficially provides more signal intensity than a hard pulse which can provide better S/N ratios. This can provide the advantage of significantly reducing the time to acquire the NMR signal with a higher signal-to-noise ratio and to increase the accuracy of the interpretation of the NMR data. Further, an AFP inversion excitation signal provides a greater inversion region as compared to a hard pulse inversion due to the $B_1$ magnetization independence of the AFP signal, see discussion below. This can provide the advantage of suppressing the NMR signal from the material that is not of interest for detection and achieve the suppression over a larger region from which the NMR signal from the desired material is to be measured.

In one or more embodiments, a excitation pulse sequence may be used according to FIG. 9B. A first hard inversion pulse 901 is transmitted by the coil, a null time 902 is observed, a first hard read pulse 903 transmitted, and a signal detection period 904 observed. The hard inversion pulse includes a RF excitation signal at substantially the Larmor frequency of 2 kHz. The RF excitation signal 941 oscillates during the pulse; however, the envelope of the oscillations is depicted in FIG. 9B and the particular oscillations are not shown for the sake of clarity, although any number of sufficient oscillations may be applied during the hard inversion pulse. The number of oscillations applied during a hard pulse is constrained by the desired length of the pulse since at a given amplitude an oscillation takes a certain period of time to complete. Typically in Earth's field NMR performed at approximately 2 kHz, a hard read pulse may contain 3 wavelengths of excitation or have a duration of approximately 1.5 ms. Pulses shorter than ~1.5 ms are less efficient because there is an insufficient number of cycles to define a frequency. The initial magnetization vectors for water and oil in the +z direction ($M_z$) are depicted as 910, 911, respectively. The magnitude of magnetization vector 910 is much greater than 911 representing the greater quantity of water present in the region of interest. At the end of the hard inversion pulse (signal), the magnetization vectors for water 912 and oil 913 are shown inverted (lie only the −z direction).

In one or more embodiments, the RF frequency used to form the hard pulse may be "chirped" to increase the range of the frequencies over which the Fourier Transform of the hard pulse exhibits a finite amplitude. This can increase the range of NMR frequencies affected by the application of the hard pulse. "Chirping" is an electrical process in which the RF signal is shifted in frequency or phase for a short period of time and then returns to the original frequency and phase. The effect of chirping the RF excitation signal during the hard pulse is to extend the range in the region of measurement over which the NMR signal(s) may be inverted. In one or more embodiments, the envelope of the hard pulse may be shaped to a pre-defined form. For example, the envelope of the hard pulse may be shaped to follow the contour of a Gaussian shape rather than a rectangular shape. This pulse shaping can eliminate or substantially suppress the amplitude of the side lobes that are formed in the frequency domain when a rectangular pulse is applied in the time domain. This can reduce the so-called phase artifacts which can distort the NMR signal during phase sensitive detection.

Referring to FIG. 9B, as may be seen, the magnitude of the magnetization vectors in the z direction decrease during null time 902. The magnetization vectors $M_z$ representing oil 913, 915, 917, 919 decrease in magnitude much faster than the magnetization vectors $M_z$ representing water 912, 914, 916 such that the oil has returned to equilibrium state prior to water reaching the zero axis 924.

Once water's magnetization vector $M_z$ reaches substantially zero, a read excitation pulse may be transmitted to the region of interest. The hard read pulse, or any read excitation signal, may be adjusted such that the detection region does not substantially exceed the inversion region. By transmitting the read pulse when the water magnetization vector $M_z$ is substantially zero, the water signal is suppressed during the read pulse. This is shown in signal detection period 904 depicting magnetization vector $M_{x,y}$ 920 for oil and no magnetization vector for water. The RF excitation signal 942 during the read pulse is depicted as a hard read pulse at substantially the Larmor resonance frequency of 2 kHz. Hard pulses have superior depth resolution and can deal with very short T2 signals. However, a read excitation signal as shown in FIG. 9A may be used instead of the hard read pulse in FIG. 9B. The RF signal 942 oscillates during the pulse; however, the envelope of the oscillations is depicted and the particular oscillations are not shown for the sake of clarity. Although the embodiments of FIGS. 9A and 9B depict an AFP inversion excitation signal and a hard inversion pulse, no such limitation is intended. Any suitable RF excitation signal capable of providing an inversion region of the first and second material may be used.

Figure 2:
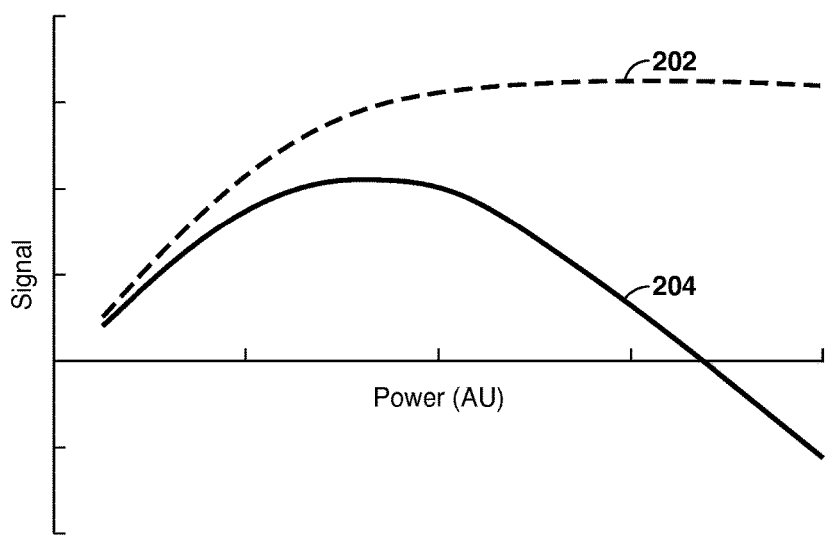
FIG. 2 illustrates an adiabatic fast passage excitation signal profile and a hard pulse excitation signal profile with respect to varying power according to one or more embodiments of the present disclosure.

Additionally, using a coil proximate one side of the region of interest can lead to the magnetic field, and thus sensitivity, dropping off when moving further from the coil which may limit the ability to modify the orientation of the magnetization vector, in particular when using hard pulses. AFP may overcome such issues because an AFP excitation signal causes a substantially $B_1$ independent rotation of magnetization providing the ability to rotate magnetization vectors $M_z$ at greater distances from the coil. FIG. 2 illustrates such effect in that the nutation angle is substantially flat with increasing power for an AFP read excitation signal 202 compared to a hard pulse 204 which varies with power. More power may be applied using an AFP excitation signal with minimal effect on the rotation of the magnetization such that a substantially uniform rotation may be achieved at various distances from the coil, whereas with a hard pulse, the rotation of magnetization is sensitive to the power applied. The sensitivity to applied power may result in variation in magnetization rotation depending on the distance from the coil and reduce the inversion region obtained. Uniform magnetization rotation at various depths, as performed by AFP, provides for improved signal and S/N generated from the region of interest at greater distances from the coil. Use of an AFP excitation signal with a flat coil design greatly increases the strength of the NMR signal from a shallow region within the region of interest and thus significantly reduces the amount of time required to accumulate an NMR signal with the desired signal intensity.

Still referring to FIG. 9B, signal detection period 904 illustrates the free induction decay (FID) signal of oil 923 received by the coil similar to FIG. 9A.

In one or more embodiments, the excitation sequence may be repeated such that a plurality of such sequences may be transmitted to the region of interest. The data obtained from the plurality of excitation sequences may be stacked in order to improve the S/N ratio of the data. The timing between excitation sequences may be any suitable time. In one or more embodiments, the sequence repetition time, TSR, may be greater than the spin lattice T1 relaxation time for the first material and less than the spin lattice T1 relaxation time for the second material. Such rapid TSR may provide additional suppression of the second material (e.g., water) signal resulting in an improved S/N ratio of the spectral display for the first material (e.g., oil). In one or more other embodiments, the plurality of excitation sequences may include different excitation signals within different sequences.

In one or more embodiments, one or more relaxation times may be measured and used to detect the first material. The relaxation times may include a free induction signal (T2*), a spin-spin (spin echo) signal (T2), a train of spin echo signals (T2), and a thermal equilibrium signal (T1), as described herein. The relaxation time T2* describes the time constant for the loss of phase coherence of the transverse magnetization after the RF excitation field is turned off. This time dependent loss of phase coherence may be referred to as the free induction decay (FID). The time constant T2 describes the characteristic decay time for the loss of phase coherence of the transverse magnetization following an application of two (or more) RF NMR signals. If two RF excitation signals are applied (e.g., a 90 degree read excitation signal and a 180 degree refocusing excitation signal) which are separated in time by $\tau$, a NMR nuclear spin echo is formed at time $2\tau$. In this mode of measurement, the pair of RF excitation signals are repeated by successively increasing the delay time $\tau$, between the first and second RF signal. In an alternative embodiment of this method, known as the CPMG (Carr-Purcell-Meiboom-Gill) sequence, a long series of RF "refocusing" excitation signals are applied every $2\tau$, time intervals following the first refocusing signal. This generates a spin echo following every time period $\tau$, following the second refocusing signal. In one or more embodiments, the refocusing excitation signals may be hard pulses.

An advantage for collecting the NMR spin echo data in this multiple signal excitation mode may be to increase the speed of data collection, which may translate to a higher S/N ratio. Another option may be to measure the proton T1 relaxation, wherein the return to thermal equilibrium may then be monitored by sampling the state of the magnetization over time either by a series of free induction measurements or spin echo measurements.

Substances having different physical states will respond differently. For example, ice responds to an excitation signal differently from water because of the structured nature of ice crystals. More particularly, the magnetic moment of hydrogen nuclei in ice and snow returns to the equilibrium state so quickly that it becomes undetectable or "invisible" to standard NMR equipment. This can be beneficial in embodiments where the area for detection contains surfaces of ice and/or snow which obscures visible detection of an organic fluid, such as oil, below the ice.

In one or more embodiments, the coil may be configured to both transmit the RF excitation signals and receive the RF NMR signals generated. In one or more other embodiments, complex coil configurations may be used to receive signals emitted from the material, including the use of a separate receiver coil and more complex transmitter/receiver coils. Such complex coil arrangements may be used to increase the sensitivity of detection. Complex coil configurations may also be used to localize the source of the NMR signal emitted in the sub-surface. Such coil configurations are compatible with and contemplated for use with the embodiments of the present disclosure and may be used in combination therewith in accordance with the knowledge of a person skilled in the art.

Figure 14:
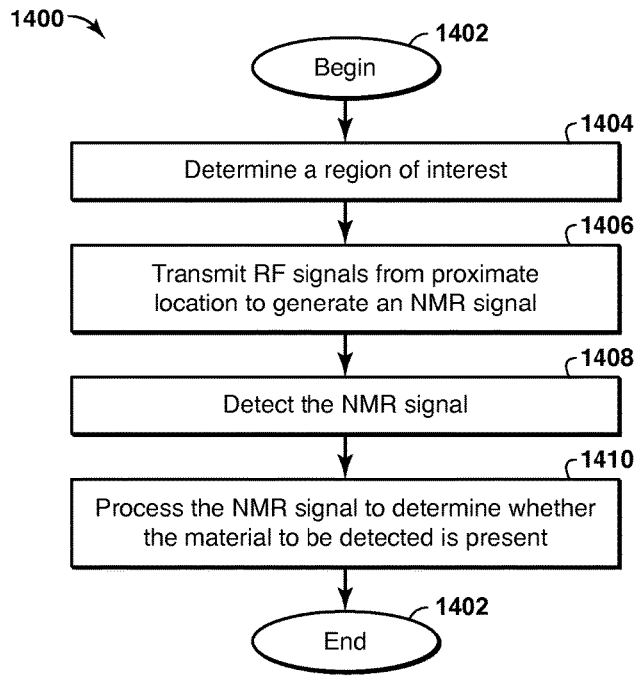
FIG. 14 shows a flow chart of a method of detecting a material within a region of interest in accordance with one or more embodiments of the present disclosure.

FIG. 14 is a flow chart of a method of detecting a material in region of interest in accordance with one or more embodiments of the present disclosure. The method 1400 begins at 1402 by first determining one or more regions of interest to be analyzed 1404. At least a portion of the region of interest is in a static magnetic field, which may be the Earth's magnetic field or a magnetic field generated by a man-made instrument. A radio frequency (RF) excitation signal is then transmitted from a location proximate the region of interest 1406. The RF excitation signal may be in the form of a radio frequency excitation signal, an electromagnetic signal, or other signal configured to generate a nuclear magnetic resonance (NMR) response signal from the volume of substances within an area of the region of interest. The NMR signal is detected 1408 and the detected NMR signal is processed 1410 to determine whether the volume of substances includes the material to be detected.

In one or more embodiments, the detecting 1408 may be done from the location proximate the region of interest and may be performed using at least part of the same coil that generated the excitation signal 1406. It should be understood that the term "detecting" or "receiving" may include simply recording by an automated process and does not specifically require human monitoring or display of data or results on a monitor as part of the function of the detection tool. In fact, the "detecting" may simply be recording data for later review at another location.

Processing 1410 may be performed at the tool at the location proximate the region of interest on a real-time or close to real-time basis, as in within one minute of the detecting step 1408. In one or more other embodiments, the processing 1410 may be performed well after steps 1402-1408 have been completed and possibly repeated, with data resulting therefrom recorded for a variety of regions of interest within a larger area of concern. Processing 1410 may include converting the analog signals to digital data; stacking data from multiple signal sequences collected for the region of interest; performing Fourier transformations on the data to convert from the time domain to the frequency domain or from the frequency domain to the time domain; generating one or more spectral plots; and/or comparing any peaks in the spectral plot to peaks representative of known substances stored in memory. With significant suppression of the second material, Fourier transformations may not be required to detect the presence of the first material. Once the signals for the one or more excitation sequences are collected for the region of interest, the process may end at block 1412.

In one or more embodiments, the NMR tool may also provide a static magnetic field 1404. In one or more embodiments, the NMR tool may further include a magnetic field generator or permanent magnet capable of developing a strong, homogenous magnetic field in the region of interest to be detected.

In one or more embodiments, the coil loop may have a "figure 8" configuration, a single loop, multiple loops, or some combination thereof. A copper tube may be used as the coil loop as it may be sturdier. The receiving coil may be integral with the transmitting coil or separate from the transmitting coil.

The NMR tool (e.g., coil) may be positioned proximate the region of interest, for example the distance may be only a few feet or inches above the surface of the region of interest to be determined or may be positioned in contact with the surface. The depth and total volume that may be detected may depend largely on the type of equipment used (e.g., a loop coil or a flat coil). The distance above the surface may vary depending on the depth capabilities of the coil to be used, for example a loop coil may be positioned at a greater distance above a surface than a flat coil since the loop coil may measure greater depths than a flat coil.

In one or more embodiments, the method contemplates moving to another region of interest to be detected and repeating at least 1406 and 1408 for that volume. These additional regions may be detected in a continuous fashion or iteratively. If done continuously, there may be some "smearing" of signals, which may be addressed by those of skill in the art using well known techniques. Such a process could be repeated for many regions of interest for detection. Processing the NMR emitted signals 1410 may be conducted after collection of signals for several different regions of interest. In one or more embodiments, these regions of interest may lie in a field of ice in an ice-prone environment in an area of concern where an oil spill may be suspected. After taking repeated measurements, the location or area of concern may be mapped to determine a location, shape, and size of an oil spill if there is an oil spill under the ice provided a suitable marking scheme is deployed for reference marks to account for the possibility of ice movement in the case of measurements in the arctic. Once an initial map is made, the steps 1404-1410 may be repeated at different locations or for longer time periods to refine the map and repeated monitoring may be conducted to determine any changes over time in the character of the oil spill. In one or more other embodiments, the mapping may also be performed in an area of concern where other types of contaminant materials may be suspected.

The detection method 1400 may be applied in a large variety of locations (e.g. areas of concern) and applications. Examples includes detecting oil spilled under ice in an arctic or sub-arctic region as part of remediation, clean-up or other oil spill response effort; detecting natural seeps of oil and other hydrocarbons in ice and snow-covered regions as part of oil exploration efforts; and monitoring or detecting spills or leaks from man-made structures such as storage tanks and pipelines that may be fully or partially covered by earthen formation, ice and/or snow. In each case, the materials to be detected are at least partially shielded from visual detection by earthen formation, water, ice, snow and combinations thereof. In one or more embodiments, an aircraft transportation device may be used, although a land or marine vehicle having a boom arm or similar device for supporting the coil and equipment may be utilized.

Figure 15:
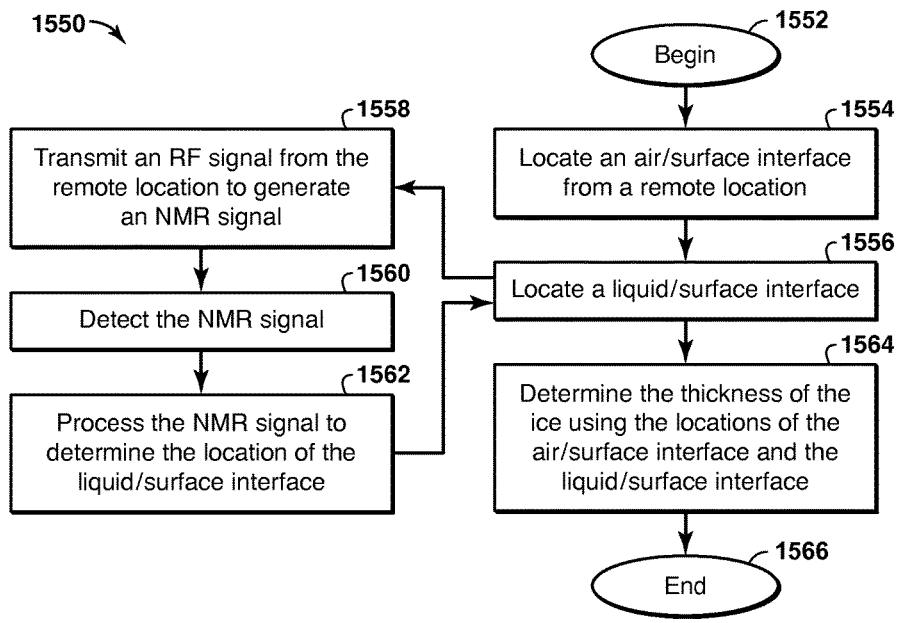
FIG. 15 shows a flow chart of a method of characterizing ice from a remote location in accordance with one or more embodiments of the present disclosure.

FIG. 15 is a flow chart of a method of characterizing ice from a location proximate the surface according to one or more embodiments of the present disclosure. FIG. 15 shows a method 1550 beginning at box 1552 and including locating an air/surface interface at the top of a volume of ice 1554 from a location proximate the surface, locating a liquid/surface interface at the bottom of the volume of ice 1556, and determining the thickness of the ice 1564 using the locations of the air/surface interface and the liquid/surface interface. Locating the liquid/surface interface 1554 includes transmitting at least one radio frequency excitation signal from the location above the volume of ice to generate a nuclear magnetic resonance (NMR) signal from the volume of ice 1558; detecting, from the location, the NMR signal generated from the volume of ice 1560; and processing the detected NMR signal 1562 to determine the location of the liquid/surface interface within the region of interest.

The method 1550 may include an analysis of the nature of the ice, such as marine or freshwater ice, land-fast ice, moving ice, first year ice, multiyear ice, or pack ice. This information may be determinable by examining the NMR signal or by another method, such as by optical observation, an interpretation based on the thickness, any other technique known to those of skill in the art, or an equivalent technique. The air/surface interface may be located 1554 using a number of techniques and apparatuses, including a rangefinding laser, an altimeter, radar, an elongated member, or some combination of these or equivalent devices. Such devices generally function to locate the upper surface of the ice, which may be visible to the naked eye or may be completely covered by snow, fog, or other visual obstruction.

Figure 16:
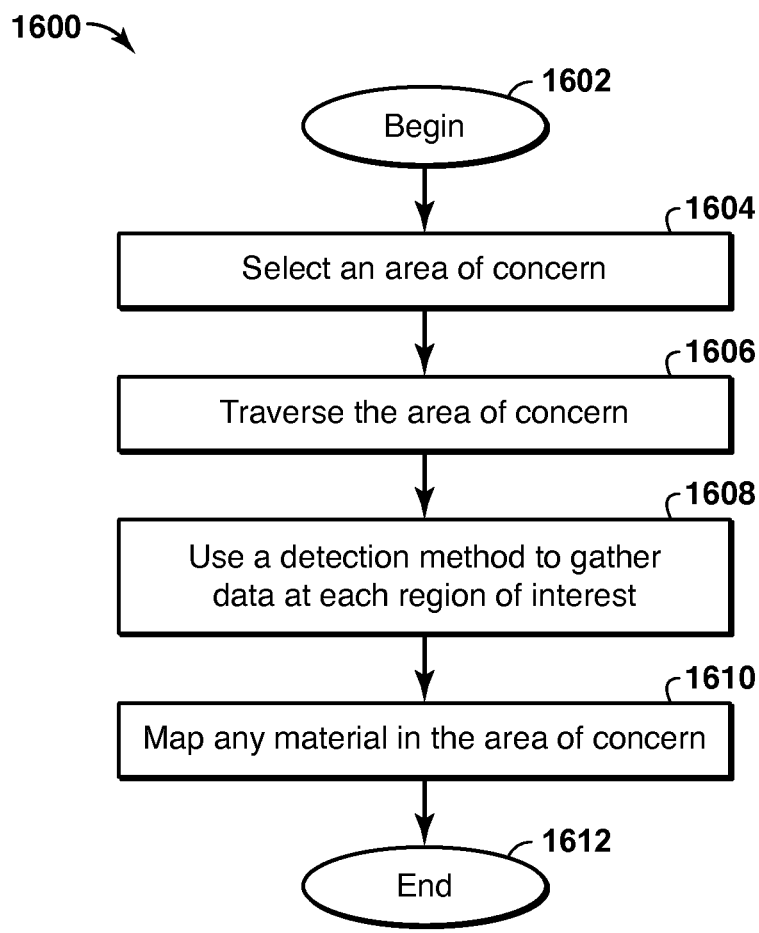
FIG. 16 shows a flow chart of a method of mapping the presence of a material within a region of interest in accordance with one or more embodiments of the present disclosure.

FIG. 16 is a flow chart of a method of mapping the presence of a material within a region of the Earth. The method 1600 begins at block 1602. An area of concern is selected 1604. The area of concern may include a surface that at least partially obscures visual detection of substances below the surface, wherein the area of concern is suspected of having a material in a region of interest in the Earth. Such areas include an offshore area having a suspected oil spill, an onshore or offshore location that may have a hydrocarbon seep, and an onshore location that may have oil or other contaminant material leaking from a pipeline, tank, or other manmade structure, or an underground aquifer, or other region of water. Once the area of concern is selected, the area of concern is traversed 1606 while using a detection method to gather data regarding the presence of the material. A nuclear magnetic resonance (NMR) tool is used to conduct the detection method, which may be one or more of the methods discussed herein.

The traversing step 1606 may be conducted using a transportation device as described herein. Traversing may include stopping at one or more of the predefined regions of interest to use a detection method to gather data 1608 if the method is to be conducted iteratively. In one or more other embodiments, the area of concern may be continuously traversed without stopping in order to obtain results more quickly. In one or more embodiments, there may be occasion to bypass a particular detection point or add a detection point as the data is gathered. Such an adjustment may be dictated or affected by weather conditions or new data gathered at a region of interest or group of regions of interest. The mapping of the regions of interest 1610 may be conducted using the data gathered in step 1608. The mapping 1610 may be as simple as hand drawing the hydrogen-containing material on readings from the detection method, but may include detailed, three-dimensional maps of the hydrogen-containing material in the area of concern if the gathered data is sufficient enough and in the proper format. The process may end at block 1612.

Optionally, there may be a planning step before the traversing step 1606. The planning may include a singular or collaborative mental exercise based on experience, or may include consideration of mapping, global positioning system (GPS), weather, ice conditions, or other data, or may include predictions of the location of the material (e.g., oil) from a numerical model and may even include a computer program designed to efficiently plan a route for the given data inputs.

In order to effectively take readings at multiple locations in an area of concern, it may be important to take measurements quickly. In one or more embodiments, the substance (s) to be detected include relatively large volumes such as macroscopic pods, pools, or clumps of hydrocarbon oil trapped within or under ice. The oil may be emulsified oil or weathered oil, which may be neutrally buoyant. In such a case, the oil may be several meters below the surface with a layer of liquid water between the surface and the oil. As pointed out previously, the NMR relaxation of protons for the water frozen in the ice is too rapid for detection making the ice effectively invisible to NMR. To expedite the measurements, the data processing is no more than a "yes" or "no" reading for the presence of oil. In other words, in this embodiment there is no need to closely analyze the signal. As such, less complete data is needed in this embodiment, permitting a more rapid traverse 1606. In this embodiment, the monitoring time may take from about 5 seconds to about ten seconds. In other embodiments, the monitoring time may extend from about 30 seconds to about one hour, or from about one minute to about 30 minutes, or from about one minute to about 15 minutes, or from about five minutes to about ten minutes for each region of interest to be detected.

Figure 17:
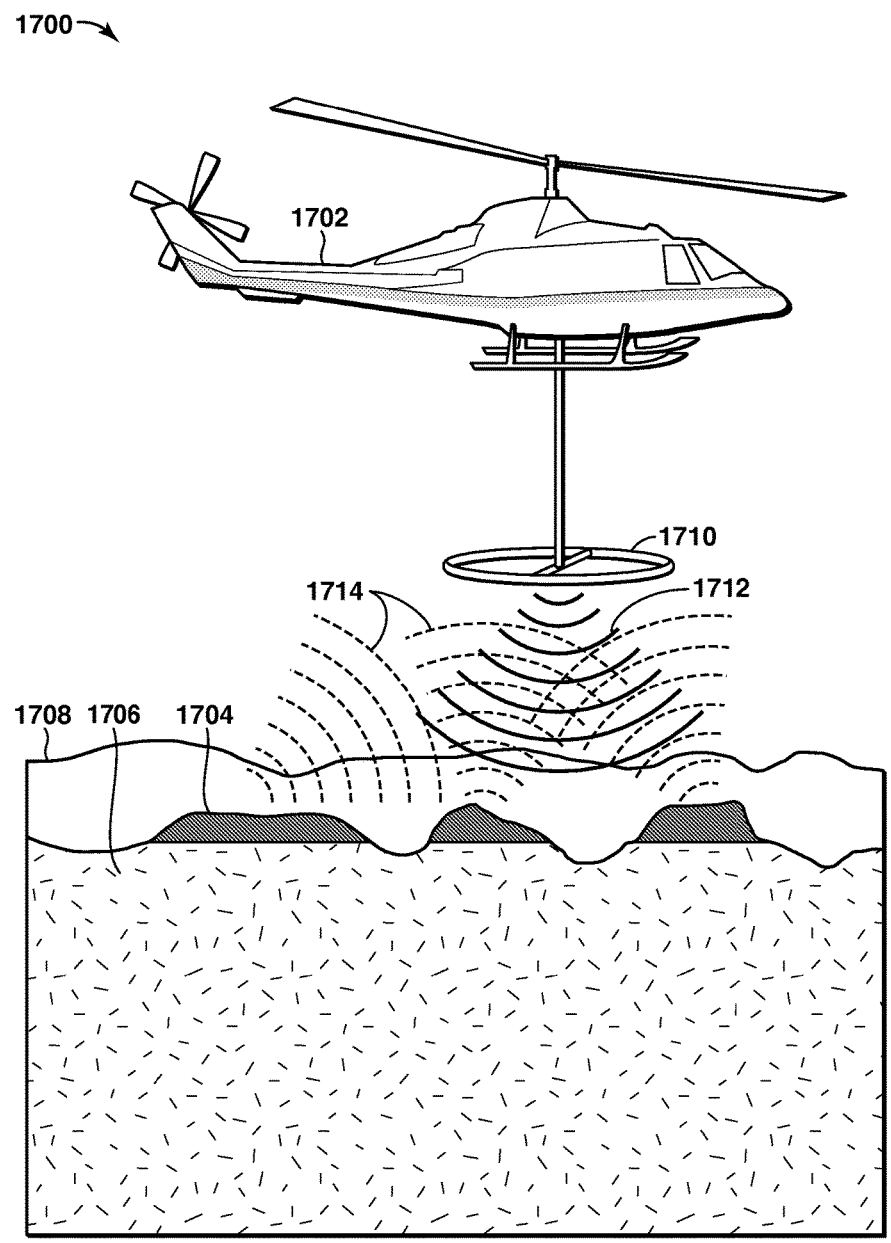
FIG. 17 is an illustration of a helicopter remotely positioned over a location and having a nuclear magnetic resonance (NMR) device operatively attached thereto for detecting a material within a region of interest in accordance with one or more embodiments of the present disclosure.

FIG. 17 is an illustration of a helicopter hovering over a region of interest and having a nuclear magnetic resonance tool operatively attached thereto for detecting a liquid under a surface in accordance with one or more embodiments of the present disclosure. The helicopter 1702 is part of a system 1700 for detecting oil under ice. The helicopter is equipped with a nuclear magnetic resonance (NMR) tool including a NMR coil 1710; and other components that may be located within the helicopter 1702. The NMR coil 1710 is sending excitation signals 1712 and receiving NMR signals 1714 from the region of interest below the helicopter 1702, which includes a body of water 1706, a surface 1708, and a material to be detected 1704 (e.g., oil).

The helicopter 1702 in one or more other embodiments may be substituted for another transportation device, the NMR coil 1710 may or may not hang below the helicopter 1702, but may be attached to the underside or skids or some other combination. The body of water 1706 may be marine or fresh (e.g. lacustrine), the surface 1708 may be water, snow, or ice. There may not be oil between the ice and the water, the oil 1704 may be slightly below the surface of the water 1706 or may be at least partially trapped inside the ice 1708 or at least partially mixed with the water 1706.

The NMR tool includes an electric current generator capable of producing an alternating current of the desired Larmor frequency (roughly 1-3 kHz for hydrogen in the Earth's magnetic field); a transmitter/receiver unit for generating low frequency excitation signals and measuring the resulting signal; a transmitter/receiver coil; an amplifier; a detector configured to perform homodyne detection methods with the emitted signals; and a computer for controlling the system and data acquisition, storing the data, processing the data, and performing interpretations. In one or more embodiments, a plurality of tool components may be utilized, for example a plurality of transmitter/receiver units, including multiple coils; a plurality of amplifiers, including one amplifier to amplify the excitation signals and one amplifier to amplify NMR signals received from the detection region.

Figure 18:
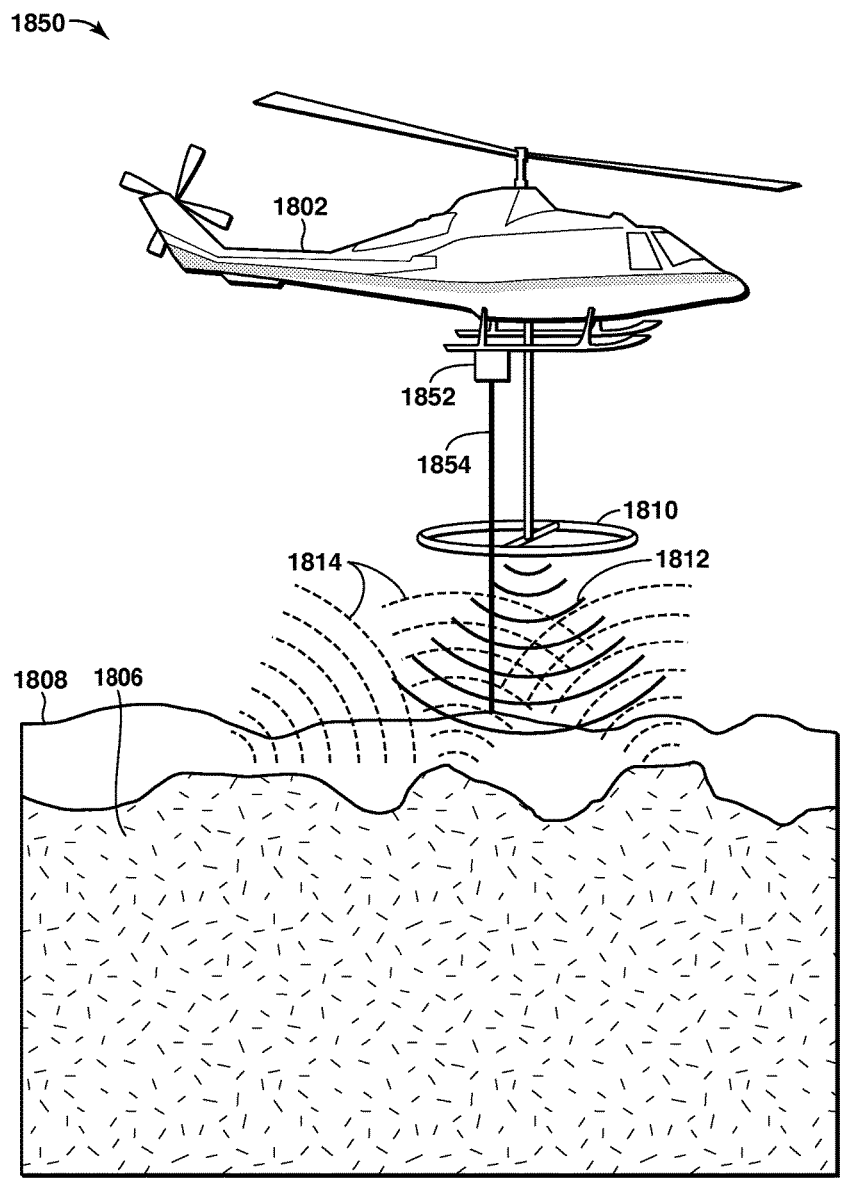
FIG. 18 is an illustration of a helicopter remotely positioned over a location and having an NMR device and another remote sensing device attached thereto for detecting an upper surface and lower surface of ice in accordance with one or more embodiments of the present disclosure.

FIG. 18 is an illustration of a helicopter remotely positioned over a region of interest and having a NMR device and another remote sensing device attached thereto for detecting an upper surface and lower surface of ice in accordance with one or more embodiments of the present disclosure. The system 1850 includes many of the same features as system 1700, but further includes an ice thickness detection device 1852 and an ice thickness detection signal 1854 emanating from the device 1852. In one or more embodiments, the device 1852 may be a laser generator and the signal 1854 may be the emitted laser for determining the location of the air/surface interface 1854. In one or more other embodiments, the device 1852 and signal 1854 may be the same, such as when using an elongated member.

Beneficially, the detection methods and systems disclosed herein provide an improvement to remote detection of a material in a region of interest in the Earth. In particular, the methods and systems disclosed herein provide improved signal intensity and S/N ratio for improved detection of the material. In one or more embodiments, the methods and systems have the benefit of sufficiently suppressing a material's (e.g., water's) signal to improve detection of the presence of another material contained in the region of interest (e.g., organic material such as an oil or other contaminant). In addition, the transporting capability of the NMR tool allows rapid inspection of large areas of concern without placing personnel and equipment directly on top of ice.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. The articles "the", "a" and "an" are not necessarily limited to mean only one, but rather are inclusive and open ended so as to include, optionally, multiple such elements.

What is claimed is:

1. A method of detecting a first material in the presence of a second material within a region of interest in the Earth comprising:

transmitting a first inversion radio frequency (RF) excitation signal with at least one coil in the presence of a static magnetic field, the excitation signal sufficient to invert magnetization vectors of both the first and second material in an inversion region within the region of interest such that a plurality of magnetization vectors of the first and second material are substantially aligned with the negative (−) z axis;

at a point in time when the longitudinal magnetization vector of the second material is substantially zero along the z-axis, transmitting a second RF excitation signal that is a read excitation signal with the at least one coil such that the NMR signal from the second material is selectively suppressed in a detection region a given distance remote from the at least one coil; and receiving any NMR signal of the first material generated by the second RF excitation signal originating from the detection region.

2. The method of claim 1, further comprising applying a magnetic pre-polarization to increase the effective static magnetic field.

3. The method of claim 1, wherein the static magnetic field is the Earth's magnetic field.

4. The method of claim 1, wherein the first inversion RF excitation signal is an adiabatic fast passage inversion sweep.

5. The method of claim 1, wherein the first inversion RF excitation signal is a hard inversion pulse.

6. The method of claim 1, wherein the second RF excitation signal is a hard read pulse.

7. The method of claim 1, wherein the second RF excitation signal is an adiabatic fast passage read sweep.

8. The method of claim 7, wherein the second RF excitation signal has a maximum amplitude value less than the first inversion RF excitation signal.

9. The method of claim 1, further comprising transmitting a third RF excitation signal to generate a spin echo which is detected by the at least one coil.

10. The method of claim 9, further comprising transmitting a plurality of RF excitation signals to generate an additional spin echoes which are detected by the at least one coil.

11. The method of claim 9, wherein the third RF excitation signal and/or the plurality of RF excitation signals are hard pulses.

12. The method of claim 1, wherein the sequence of first inversion RF excitation signal, second RF excitation signal and any additional excitation signals in the sequence is repeated at a repetition rate greater than the T1 relaxation rate of the first material and less than the T1 relaxation time of the second material.

13. The method of claim 1, wherein the detection region does not substantially exceed the inversion region.

14. The method of claim 1, wherein the at least one coil is a flat coil.

15. The method of claim 14, wherein the flat coil comprises a central coil array including a plurality of substantially parallel wire elements; and a first wire return side and a second wire return side opposite the first wire return side, each return side having a varying radius of curvature.

16. The method of claim 5, wherein the at least one coil is operatively connected to a transmitter; receiver; and at least one switch and configured to provide a broadband signal response at a transmitting Q factor when transmitting the adiabatic fast passage sweep and to receive signal response in a narrow band at a greater Q factor compared to the transmitting Q factor.

17. The method of claim 1, further comprising applying at least a first depth profiling RF excitation signal and a second depth profiling RF excitation signal, wherein the first depth profiling RF excitation signal has a different amplitude from the second RF depth profiling RF excitation signal.

18. The method of claim 17, wherein the first depth profiling RF excitation signal and the second RF depth profiling RF excitation signal are hard pulses.

19. The method of claim 1, wherein the first material is an organic material and the second material is water.

20. The method of claim 18, wherein the organic material is an oil.

21. The method of claim 18, wherein the organic material originates from activities associated with an industrial process.

22. The method of claim 1, wherein the region is under a surface of Earthen formation, water, snow, or ice.

23. The method of claim 1, further comprising mapping a plurality of regions in an area of concern to determine the presence of the first material.

24. A method of detecting a first material in the presence of a second material within a region of the Earth comprising:

transmitting a first adiabatic fast passage inversion sweep with at least one coil in the presence of a static magnetic field, the sweep sufficient to invert magnetization vectors of both the first and second material in an inversion region such that the magnetization vectors of the first and second material are substantially aligned with the negative (−) z axis;

at a point in time when the longitudinal magnetization vector of the second material is substantially zero along the z-axis, transmitting a second RF excitation signal that is a read excitation signal with the at least one coil such that the NMR signal from the second material is selectively suppressed in a detection region a given distance remote from the at least one coil; and receiving any NMR signal of the first material generated by the second RF excitation signal originating from the detection region, wherein the static magnetic field is Earth's magnetic field.

25. The method of claim 24, wherein the second RF excitation signal is an adiabatic fast passage read sweep which rotates the longitudinal magnetization to generate transverse magnetization.

26. The method of claim 24, wherein the first material is an organic material and the second material is water.

27. The method of claim 24, wherein the region is located under a surface of ice.

28. A system for detecting a material within a region of interest in the Earth comprising:

at least one coil positioned proximate to the region;

a transmitter operatively connected to the at least one coil;

a receiver operatively connected to the at least one coil; and at least one switch configured to provide a broadband signal response in the at least one coil at a transmitting Q factor when transmitting an adiabatic fast passage excitation signal and to receive a NMR signal response in a narrow band at a greater Q factor compared to the transmitting Q factor.

29. The system of claim 28, further comprising a tuning capacitor operatively connected to the at least one coil.

* * * * *